United States Patent
Sugimoto et al.

(10) Patent No.: US 12,316,281 B2
(45) Date of Patent: May 27, 2025

(54) RECEPTION CIRCUIT FOR OPTICAL COMMUNICATION

(71) Applicant: SUMITOMO ELECTRIC INDUSTRIES, LTD., Osaka (JP)

(72) Inventors: Yoshiyuki Sugimoto, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 347 days.

(21) Appl. No.: 17/932,743

(22) Filed: Sep. 16, 2022

(65) Prior Publication Data
US 2023/0092750 A1 Mar. 23, 2023

(30) Foreign Application Priority Data

Sep. 21, 2021 (JP) .................................. 2021-153448
Sep. 21, 2021 (JP) .................................. 2021-153449

(51) Int. Cl.
*H03F 3/08* (2006.01)
*H03F 1/08* (2006.01)
*H03F 3/45* (2006.01)
*H03G 3/30* (2006.01)
*H04B 10/60* (2013.01)

(52) U.S. Cl.
CPC ......... *H03F 1/083* (2013.01); *H03F 3/45179* (2013.01); *H03F 3/45973* (2013.01); *H03G 3/3084* (2013.01); *H04B 10/60* (2013.01)

(58) Field of Classification Search
CPC .. H03F 1/083; H03F 3/45179; H03F 3/45973; H03F 3/087; H03F 3/45475; H03F 2200/264; H03F 3/45183; H03F 3/082; H03F 3/45103; H03F 2200/405; H03F 2203/45392; H03F 3/45; H03F 3/08; H03G 3/3084; H03G 1/0023; H03G 1/0088; H03G 1/0035; H03G 3/001; H03G 1/00;
(Continued)

(56) References Cited

U.S. PATENT DOCUMENTS 9,577,753 B2 * 2/2017 Sugimoto .......... H04B 10/6933
10,819,425 B2 * 10/2020 Tanaka .................... H03F 1/083
(Continued)

FOREIGN PATENT DOCUMENTS

JP 2020-005124 1/2020

*Primary Examiner* — Khanh V Nguyen
(74) *Attorney, Agent, or Firm* — IPUSA, PLLC

(57) ABSTRACT

A reception circuit includes an input terminal configured to receive an input current; a voltage signal circuit being configured to convert a current signal into a voltage signal; a reference voltage circuit configured to generate a reference voltage in accordance with a first feedback current; a differential amplifier circuit configured to generate a differential signal in accordance with a voltage difference between the voltage signal and the reference voltage; and an offset control circuit configured to generate the first feedback current and a second feedback current, adjust the first feedback current when the voltage signal has an average voltage value greater than the reference voltage, and subtract the second feedback current from the input current such that the offset of the differential signal falls within the tolerance when the voltage signal has an average voltage value smaller than the reference voltage.

16 Claims, 17 Drawing Sheets

(58) Field of Classification Search
CPC . H03G 3/00; H03G 3/30; H04B 10/60; H04B 10/695
See application file for complete search history.

(56) References Cited

U.S. PATENT DOCUMENTS 11,601,203 B2 * 3/2023 Tanaka ................... H04B 10/69
2020/0007087 A1 1/2020 Sugimoto

* cited by examiner

RECEPTION CIRCUIT FOR OPTICAL COMMUNICATION

CROSS-REFERENCE TO RELATED APPLICATION

The present application is based upon and claims priority under 35 U.S.C. § 119 to Japanese Patent Application No. 2021-153448 and Japanese Patent Application No. 2021-153449 filed on Sep. 21, 2021, the entire contents of which are incorporated herein by reference.

TECHNICAL FIELD

The present disclosure relates to a reception circuit for optical communication.

BACKGROUND

A reception circuit for optical communication receives a current signal converted from an optical signal by a photodiode or the like as an input current, and converts the received current signal into a voltage signal by a transimpedance amplifier. Further, a reception circuit that outputs a differential voltage signal may include an automatic offset control circuit which compensates for an offset generated in the differential voltage signal. The automatic offset control circuit draws a portion of the input current to compensate for the offset. For example, the automatic offset control circuit controls the extraction amount from the input current so as to reduce the magnitude of the offset.

The reception circuit according to the present disclosure includes an input terminal configured to receive an input current; a voltage signal circuit having an input node, the voltage signal circuit being configured to convert a current signal into a voltage signal, the current signal being input to the input node, and the input node being coupled to the input terminal; a reference voltage circuit configured to generate a reference voltage in accordance with a first feedback current; a differential amplifier circuit configured to generate a differential signal in accordance with a voltage difference between the voltage signal and the reference voltage; and an offset control circuit configured to generate the first feedback current and a second feedback current, adjust the first feedback current such that an offset of the differential signal falls within a tolerance when the voltage signal has an average voltage value greater than the reference voltage, and subtract the second feedback current from the input current such that the offset of the differential signal falls within the tolerance when the voltage signal has the average voltage value smaller than the reference voltage.

The reception circuit according to the present disclosure includes a first input terminal configured to receive a first input current; a first voltage signal circuit having a first input node, the first voltage signal circuit being configured to convert a first current signal into a first voltage signal, the first current signal being input to the first input node, and the first input node being coupled to the first input terminal; a first reference voltage circuit configured to generate a first reference voltage in accordance with a first feedback current; a first offset control circuit configured to generate the first feedback current and a second feedback current in accordance with a first offset between the first voltage signal and the first reference voltage, adjust the first feedback current such that the first offset falls within a tolerance when the first voltage signal has an average voltage value greater than the first reference voltage, and subtract the second feedback current from the first input current such that the first offset falls within the tolerance when the first voltage signal has an average voltage value smaller than the first reference voltage; a second input terminal configured to receive a second input current; a second voltage signal circuit having a second input node, the second voltage signal circuit being configured to convert a second current signal into a second voltage signal, the second current signal being input to the second input node, and the second input node being coupled to the second input terminal; a second reference voltage circuit configured to generate a second reference voltage in accordance with a third feedback current; a second offset control circuit configured to generate the third feedback current and a fourth feedback current in accordance with a second offset between the second voltage signal and the second reference voltage, adjust the third feedback current such that the second offset falls within a tolerance when the second voltage signal has an average voltage value greater than the second reference voltage, and subtract the fourth feedback current from the second input current such that the second offset falls within the tolerance when the second voltage signal has an average voltage value smaller than the second reference voltage; and a differential amplifier circuit configured to generate a differential signal in accordance with a voltage difference between the first voltage signal and the second voltage signal.

DETAILED DESCRIPTION

Figure 1:
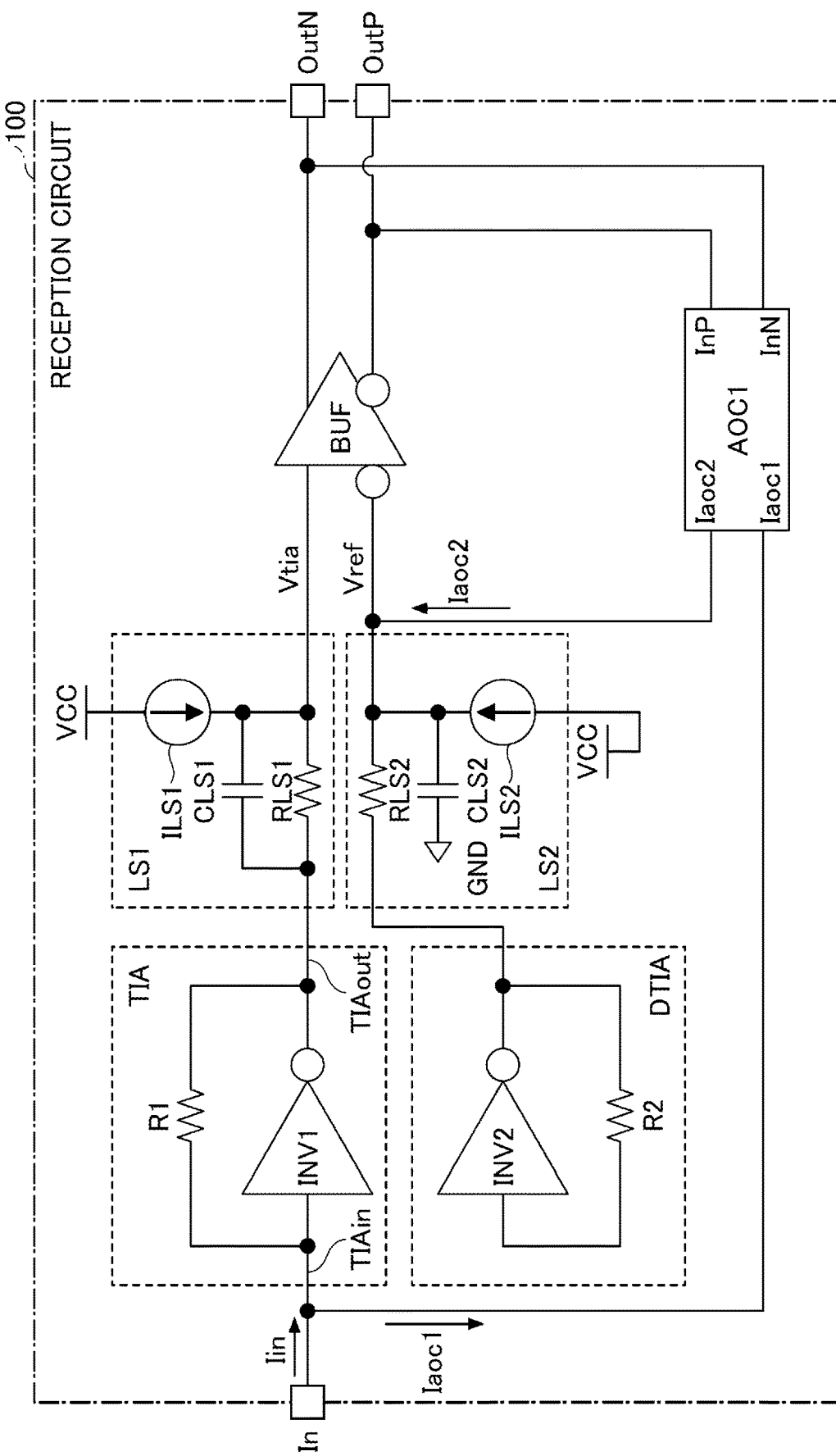
FIG. 1 is a block diagram illustrating a reception circuit according to a first embodiment.

Details of Embodiments of the Present Disclosure

A specific example of a reception circuit of the present disclosure will be described below with reference to the drawings. In the following description, the same elements or corresponding elements are denoted by the same reference numerals, and description thereof may be omitted. Further, reference signs of a terminal, a signal line, and a node are also used as reference signs indicating a signal, a voltage, or a current.

First Embodiment

<Circuit Configuration of Reception Circuit>

FIG. 1 is a block diagram illustrating a reception circuit according to a first embodiment. For example, a reception circuit 100 illustrated in FIG. 1 is included in an optical receiver or the like that receives an optical signal. The reception circuit 100 includes an input terminal In that receives an input current Iin from a light receiving element (such as a photodiode) (not illustrated), and output terminals OutP and OutN that output a voltage signal generated in accordance with the input current Iin as a differential signal OutP and OutN.

The light receiving element generates the input current Iin in accordance with the received optical signal. The optical signal transmitted through a long-distance optical fiber is attenuated and becomes weak, and the input current Iin generated by the light receiving element also becomes weak. The reception circuit 100 amplifies the input current Iin and converts the input current Iin into a voltage signal. The reception circuit 100 outputs the voltage signal as the differential signal OutP and OutN. The differential signal OutP and OutN includes a pair of output signals OutP and OutN. One signal OutP of the pair of output signals is also referred to as a positive phase signal, and the other signal OutN of the pair of output signals is referred to as a negative phase signal. The positive phase signal OutP and the negative phase signal OutN are complementary to each other. The positive phase signal OutP has a phase different from that of the negative phase signal OutN by 180°.

For example, when the positive phase signal OutP increases, the negative phase signal OutN decreases, and when the positive phase signal OutP decreases, the negative phase signal OutN increases. For example, when the positive phase signal OutP reaches a peak value, the negative phase signal OutN reaches a bottom value, and when the positive phase signal OutP reaches the bottom value, the negative phase signal OutN reaches the peak value. For example, the negative phase signal OutN has the same amplitude as that of the positive phase signal outP. In a differential signal other than the differential signal OutP and OutN, the positive phase signal and the negative phase signal constituting the differential signal have the above-described relationship with each other. Although the terms "positive phase signal" and "negative phase signal" are used in the description herein, the relationship between the output signal OutP and the output signal OutN is as described using the positive phase signal and the negative phase signal when the output signal OutP and the output signal OutN are described below.

If an offset compensation described later is not performed, for example, when an average value (direct current (DC) component) of the input current Iin increases, the reception circuit 100 increases an average voltage value (DC component) of the output signal OutP and decreases an average voltage value (DC component) of the output signal OutN. If the offset compensation is not performed, when the average value (DC component) of the input current Iin decreases, the reception circuit 100 decreases the average voltage value (DC component) of the output signal OutP and increases the average voltage value (DC component) of the output signal OutN.

The reception circuit 100 reduces the difference between the average voltage value (DC component) of the output signal OutP and the average voltage value (DC component) of the output signal OutN by performing the offset compensation. The offset represents the difference between the average voltage value (DC component) of the output signal OutP and the average voltage value (DC component) of the output signal OutN.

The offset may be referred to as a DC offset to clearly indicate that it is a difference between DC components. That is, a compensation of the offset means bringing the offset closer to zero. In general, it is preferable that the offset in the differential signal is reduced within a practically allowable range (i.e. tolerance). Note that when an offset is used with respect to two voltage signals other than the differential signal, it means the difference between an average value (DC component) of one voltage signal and an average value (DC component) of the other voltage signal. The reception circuit 100 amplifies a signal component (AC component) of the input current and converts the signal component into a voltage signal to output the voltage signal as a signal component (AC component) of the differential signal OutP and OutN. The voltage amplitude of the signal component of the differential signal OutP and OutN is equal to the difference between the signal component of the voltage of the positive phase signal OutP and the signal component of the voltage of the negative phase signal OutN. For example, when the amplitude of the signal component of the input current Iin increases, the voltage amplitude of the signal component of the differential signal OutP and OutN also increases. The differential signal OutP and OutN output from the output terminals OutP and OutN are output to a signal processing circuit such as a Digital Signal Processor (DSP) and processed. The signal processing circuit may be, for example, a clock data recovery circuit.

The reception circuit 100 includes, for example, a transimpedance amplifier circuit (TIA circuit) TIA, a level-shift circuit LS1, a dummy transimpedance amplifier circuit (dummy TIA circuit) DTIA, a level-shift circuit LS2, a buffer circuit BUF, and an automatic offset control circuit (AOC) circuit AOC1.

For example, each circuit of the reception circuit 100 is integrated into a single semiconductor integrated circuit chip. Thus, variations in electrical characteristics among a plurality of circuits formed by using the same circuit element can be reduced. For example, if the dummy TIA circuit DTIA has the same circuit configuration as that of the TIA circuit TIA, it is possible to reduce the influence of variations in the respective electrical characteristics on the reception circuit 100. For example, when the electrical characteristics of the transistors constituting the TIA circuit TIA deviate in a certain direction from the design values, the electrical characteristics of the transistors constituting the dummy TIA circuit DTIA formed on the same semiconductor integrated circuit chip deviate in the same direction, so that the influence of the deviation of the respective electrical characteristics may be offset. Further, by making the level-shift circuit LS2 the same circuit configuration as that of the level-shift circuit LS1, the influence of variations in the respective electrical characteristics can be reduced. As a result, an accuracy of an offset adjustment of the differential signal OutP and OutN by the automatic offset control circuit AOC1 can be improved.

When the dummy TIA circuit DTIA has the same circuit configuration as that of the TIA circuit TIA, the dummy TIA circuit DTIA can be expected to have the same electrical characteristics as those of the TIA circuit TIA. Further, by making the level-shift circuit LS2 have the same circuit configuration as that of the level-shift circuit LS1, the level-shift circuit LS2 can be expected to have the same electrical characteristics as those of the level-shift circuit LS1.

The TIA circuit TIA and the level-shift circuit LS1 are examples of a voltage signal circuit. The TIA circuit TIA is an example of a first amplifier circuit. The dummy TIA circuit DTIA and the level-shift circuit LS2 are examples of a reference voltage circuit. The dummy TIA circuit DTIA is an example of a second amplifier circuit that generates a fixed voltage. The buffer circuit BUF is an example of a differential amplifier circuit.

The TIA circuit includes an inverting amplifier circuit INV1 and a resistive element R1. The input of the inverting amplifier circuit INV1 is electrically connected to the input terminal In via an input node TIAin. The inverting amplifier circuit INV1 is connected to the level-shift circuit LS1 via an output node TIAout. The resistive element R1 is connected between the input node TIAin and the output node TIAout.

The TIA circuit TIA converts the input current Iin input to the input node TIAin into a voltage signal by the inverting amplifier circuit INV1 and the resistive element R1, and inverts and amplifies the voltage signal. Then the TIA circuit TIA outputs the inverted and amplified voltage signal to the output node TIAout. The inverting amplifier circuit INV1 performs, for example, inverting amplification. For example, when the input current Iin increases, the voltage output to the output node TIAout decreases, and when the input current Iin decreases, the voltage output to the output node TIAout increases. The gain of the TIA circuit TIA is expressed as an impedance (resistance value). The gain of the TIA circuit TIA is mainly determined by the resistance value of the resistive element R1.

The level-shift circuit LS1 includes, for example, a resistive element RLS1, a capacitative element CLS1, and a current source ILS1. The resistive element RLS1 and the capacitative element CLS1 are connected in parallel between the output node TIAout and a node Vtia connected to one of the inputs of the buffer circuit BUF. The current source ILS1 is connected between a power supply line VCC and the node Vtia. The power supply line VCC is a power supply line for supplying a power supply voltage Vcc.

The level-shift circuit LS1 generates a voltage signal Vtia by level-shifting the voltage signal TIAout output from the TIA circuit TIA to the high potential side by the DC voltage generated in the resistive element RLS1. The DC voltage of the resistive element RLS1 is generated when a DC current supplied from the current source ILS1 flows through the resistive element RLS1. The voltage signal TIAout is an example of an intermediate voltage signal. An average voltage value (DC component) of the voltage signal Vtia is higher than the average voltage value (DC component) of the voltage signal TIAout by the DC voltage of the resistive element RLS1.

The capacitative element CLS1 transmits high-frequency components of a signal input to the level-shift circuit LS1 to the output earlier than the resistive element RLS1. For example, deterioration of the falling and falling of the pulse wave of the voltage signal whose level is shifted by the level-shift circuit LS1 are suppressed by the capacitative element CLS1. The capacitative element CLS1 is a so-called speed-up capacitor. The current source ILS1 may be configured by, for example, a p-channel Metal Oxide Semiconductor (MOS) transistor. In order to adjust an amount of current to be supplied, the current source ILS1 may be configured by a current mirror circuit including the p-channel MOS transistor. Alternatively, the current source ILS1 may be configured by using a resistive element instead of the p-channel MOS transistor.

Thus, the average value of the output voltage of the level-shift circuit LS1 can be made greater than the average value of the input voltage of the level-shift circuit LS1. Further, the voltage range of the voltage signal Vtia input to the buffer circuit BUF can be set to a voltage range for appropriately operating the buffer circuit BUF by the level-shift circuit LS1. As a result, the buffer circuit BUF can generate an appropriate differential signal corresponding to the input current Iin. The appropriate differential signal is, for example, a differential signal with little distortion. For example, if the voltage range of the voltage signal Vtia is not within an appropriate range, the output signals OutP and OutN of the buffer circuit BUF may be saturated and distorted. For example, the signal component of the voltage signal Vtia generated in accordance with the signal component of the input current Iin is superimposed on the voltage value (average value) of the voltage signal Vtia and input to the buffer circuit BUF. While the current from the current source ILS1 flows into the output node TIAout of the TIA circuit TIA, the current flowing into the TIA circuit TIA from the current source ILS1 is offset by increasing the current amount of the current source (the current source ITIA in FIG. 2) inside the TIA circuit TIA.

Instead of increasing the current amount of the current source ITIA inside the TIA circuit TIA, a current source may be added between the input node of the level-shift circuit LS1 and a ground line GND, and a current from the current source ILS1 may flow to the current source. The current source added at this time can be composed of, for example, an n-channel MOS transistor. The current source to be added may be configured by a current mirror circuit including the n-channel MOS transistor in order to adjust the current amount. Alternatively, the current source to be added may be configured by using a resistive element instead of the n-channel MOS transistor.

The dummy TIA circuit DTIA has, for example, the same circuit configuration as that of the TIA circuit TIA except that an input current is not input to the input node. Since the input node of the dummy TIA circuit DTIA is open, a current signal is not input to the input node from outside of the circuit. By configuring the dummy TIA circuit DTIA with the same circuit elements as those of the TIA circuit TIA, the circuit design of the reception circuit 100 can be simplified. The dummy TIA circuit DTIA includes an inverting amplifier circuit INV2 and a resistive element R2 connected between an output and an input of the inverting amplifier circuit INV2. For example, the inverting amplifier circuit INV2 may have the same circuit configuration as that of the inverting amplifier circuit INV1, and the resistive element R2 may have the same resistance value as that of the resistive element R1. The dummy TIA circuit DTIA generates a predetermined reference voltage, and outputs the generated reference voltage to the level-shift circuit LS2. For example, as will be described later, the voltage value of the reference voltage of the dummy TIA circuit DTIA is set to be smaller than the voltage value of the voltage signal TIAout output from the TIA circuit TIA when the input current Iin is zero (note that extraction is not performed when the input current Iin is zero).

The level-shift circuit LS2 includes, for example, a resistive element RLS2, a capacitative element CLS2, and a current source ILS2. The resistive element RLS2 is connected between the output of the dummy TIA circuit DTIA and a reference voltage line Vref connected to the other input of the buffer circuit BUF. The capacitative element CLS2 is connected between the reference voltage line Vref and the ground line GND. The current source ILS2 is connected between the power supply line VCC and the reference voltage line Vref.

The level-shift circuit LS2 generates the reference voltage Vref on the reference voltage line Vref by level-shifting the fixed voltage output from the dummy TIA circuit DTIA to the high potential side by the DC voltage generated in the resistive element RLS2. The DC voltage of the resistive element RLS2 is generated when a DC current supplied from the current source ILS2 flows through the resistive element RLS2. The value of the reference voltage Vref is higher than the value of the reference voltage input to the level-shift circuit LS2 by an amount corresponding to the DC voltage of the resistive element RLS2. Therefore, similarly to the level-shift circuit LS1, the level-shift circuit LS2 can make the average value of the voltage output from the level-shift circuit LS2 greater than the average value of the voltage input to the level-shift circuit LS2.

The capacitative element CLS2 allows noise generated in the reference voltage line Vref to flow to the ground line GND, thereby stabilizing the voltage of the reference voltage line Vref (reference voltage Vref). The capacitative element CLS1 is a so-called bypass capacitor. The current source ILS2 can be configured by, for example, a p-channel MOS transistor. In order to adjust the amount of current to be supplied, the current source ILS2 may be configured by a current mirror circuit including the p-channel MOS transistor. Alternatively, the current source ILS2 may be configured by using a resistive element instead of the p-channel MOS transistor.

For example, when the current source ILS1 is formed by a p-channel MOS transistor, the current source ILS2 may also be formed by a p-channel MOS transistor. In this case, the p-channel MOS transistor constituting the current source ILS2 preferably has the same electrical characteristics as those of the p-channel MOS transistor constituting the current source ILS1. While the current from the current source ILS2 flows into the dummy TIA circuit DTIA, the current amount flowing into the dummy TIA circuit DTIA from the current source ILS2 is offset by increasing the current amount of the current source inside the dummy TIA circuit DTIA. Instead of increasing the current amount of the current source inside the dummy TIA circuit DTIA, a current source may be added between the ground line GND and the input node of the level-shift circuit LS2 connected to the output node of the dummy TIA circuit DTIA, and a current from the current source ILS2 may be supplied to the current source.

As will be described later, the reference voltage Vref is set to a value smaller than the average value (DC component) of the voltage value Vtia when the input current Iin is zero in a state where the automatic offset control circuit AOC1 is not in operation (when a feedback current Iaoc1 is zero). When the input current Iin becomes greater than zero, the voltage value (average value) of the voltage signal Vtia decreases, and when the input current Iin further continues to increase, the voltage value eventually becomes smaller than the reference voltage Vref.

When the voltage value (average value) of the voltage signal Vtia is smaller than the reference voltage Vref, the feedback current Iaoc1 is drawn from the input current Iin to decrease the current signal input to the input node TIAin, thereby increasing the voltage value (average value) of the voltage signal Vtia to be close to the reference voltage Vref. As a result, the automatic offset control circuit AOC1 can perform automatic offset control for suppressing an increase in the offset of the differential signal OutP and OutN.

The buffer circuit BUF includes a differential input and a differential output. The buffer circuit BUF amplifies the difference Vtia−Vref between the voltage of the voltage signal Vtia received at the differential input and the reference voltage Vref, and outputs the differential signal OutP and OutN to the output terminals OutP and OutN. In this manner, by generating the reference voltage Vref, the single-phase voltage signal Vtia generated from the single-phase input current Iin can be converted into the differential signal OutP and OutN by the buffer circuit BUF. The buffer circuit BUF may be configured by a single amplifier, or may be configured by multiple amplifiers connected in cascade from the differential input to the differential output.

The buffer circuit BUF performs, for example, inverting amplification. For example, the voltage signal Vtia is input to a non-inverting input terminal of the buffer circuit BUF, the reference voltage Vref is input to an inverting input terminal of the buffer BUF, a non-inverting output terminal of the buffer BUF is connected to the output terminal OutN, and an inverting output terminal of the buffer BUF is connected to the output terminal OutP. Accordingly, when the voltage signal Vtia increases, the voltage of the positive phase signal OutP decreases, and when the voltage signal Vtia decreases, the voltage of the positive phase signal OutP increases. As described above, when the voltage of the positive phase signal OutP decreases, the voltage of the negative phase signal OutN increases, and when the voltage of the positive phase signal OutP increases, the voltage of the negative phase signal OutN decreases.

The automatic offset control circuit AOC1 includes input terminals InP and InN connected to the output terminals OutP and OutN, respectively, a feedback current terminal Iaoc1 connected to the input terminal In, and a feedback current terminal Iaoc2 connected to the reference voltage line Vref. The automatic offset control circuit AOC1 subtracts the feedback current Iaoc1 from the input current Iin or outputs the feedback current Iaoc2 to the reference voltage line Vref in accordance with the offset (the difference between the average voltage value of the positive phase signal OutP and the average voltage value of the negative phase signal OutN). That is, the automatic offset control circuit AOC1 subtracts the feedback current Iaoc1 from the input current Iin or outputs the feedback current Iaoc2 to the reference voltage line Vref in accordance with the magnitude relation between the average voltage value of the output signal OutP and the average voltage value of the output signal OutN.

The automatic offset control circuit AOC1 performs control for switching the magnitudes of the feedback currents Iaoc1 and Iaoc2 in accordance with whether the input current Iin is smaller or greater than a predetermined value. For example, when the input current Iin is smaller than the predetermined value, the automatic offset control circuit AOC1 controls not to flow the feedback current Iaoc1 but to flow the feedback current Iaoc2 to be added to the current supplied from the current source ILS2. Here, the addition of the current is performed by supplying the feedback current Iaoc2 to the resistive element RLS2 in the same direction as the direction of the current supplied from the current source ILS2. At this time, for example, the feedback current Iaoc2 is greater than the feedback current Iaoc1. When the input current Iin is equal to or greater than the predetermined value, the automatic offset control circuit AOC1 controls the feedback currents Iaoc1 and Iaoc2 to flow in accordance with the input current Iin. The feedback current Iaoc2 is an example of a first feedback current, and the feedback current Iaoc1 is an example of a second feedback current.

The differential signal OutP and OutN changes in accordance with the input current Iin. For example, if no current flows through the feedback current terminal Iaoc1, the voltage signal Vtia decreases and the differential signal OutP and OutN increase as the input current Iin increases. Further, when the input current Iin decreases, the voltage signal Vtia increases and the differential signal OutP and OutN decreases. Therefore, the differential signal OutP and OutN is generated as a non-inverted amplified signal of the input current Iin. The magnitude (amplitude) of the differential signal OutP and OutN corresponds to a voltage difference OutP−OutN between the positive phase signal OutP and the negative phase signal OutN.

Figure 3:
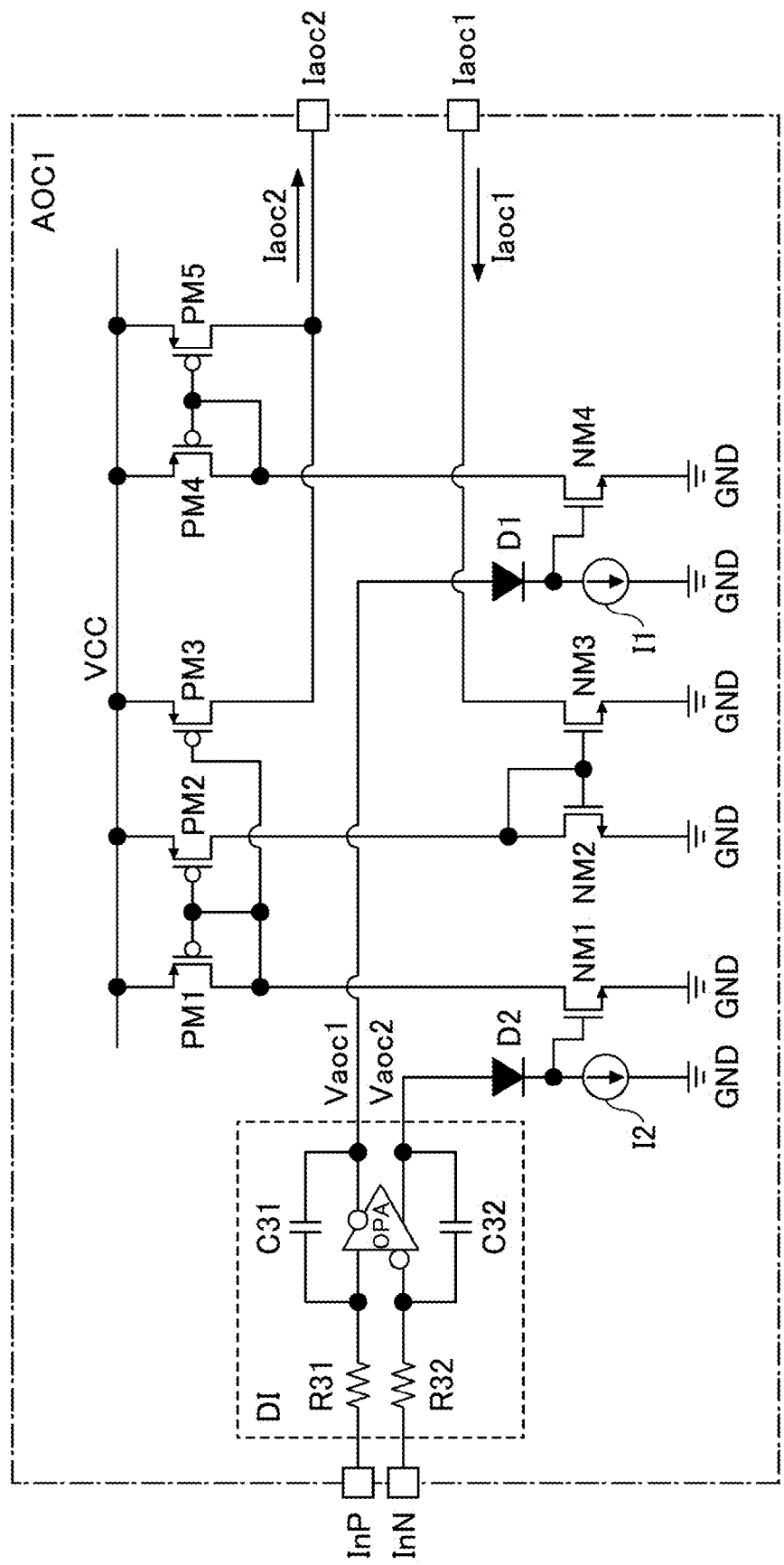
FIG. 3 is a circuit diagram illustrating an example of an automatic offset control circuit of FIG. 1.
Figure 4:
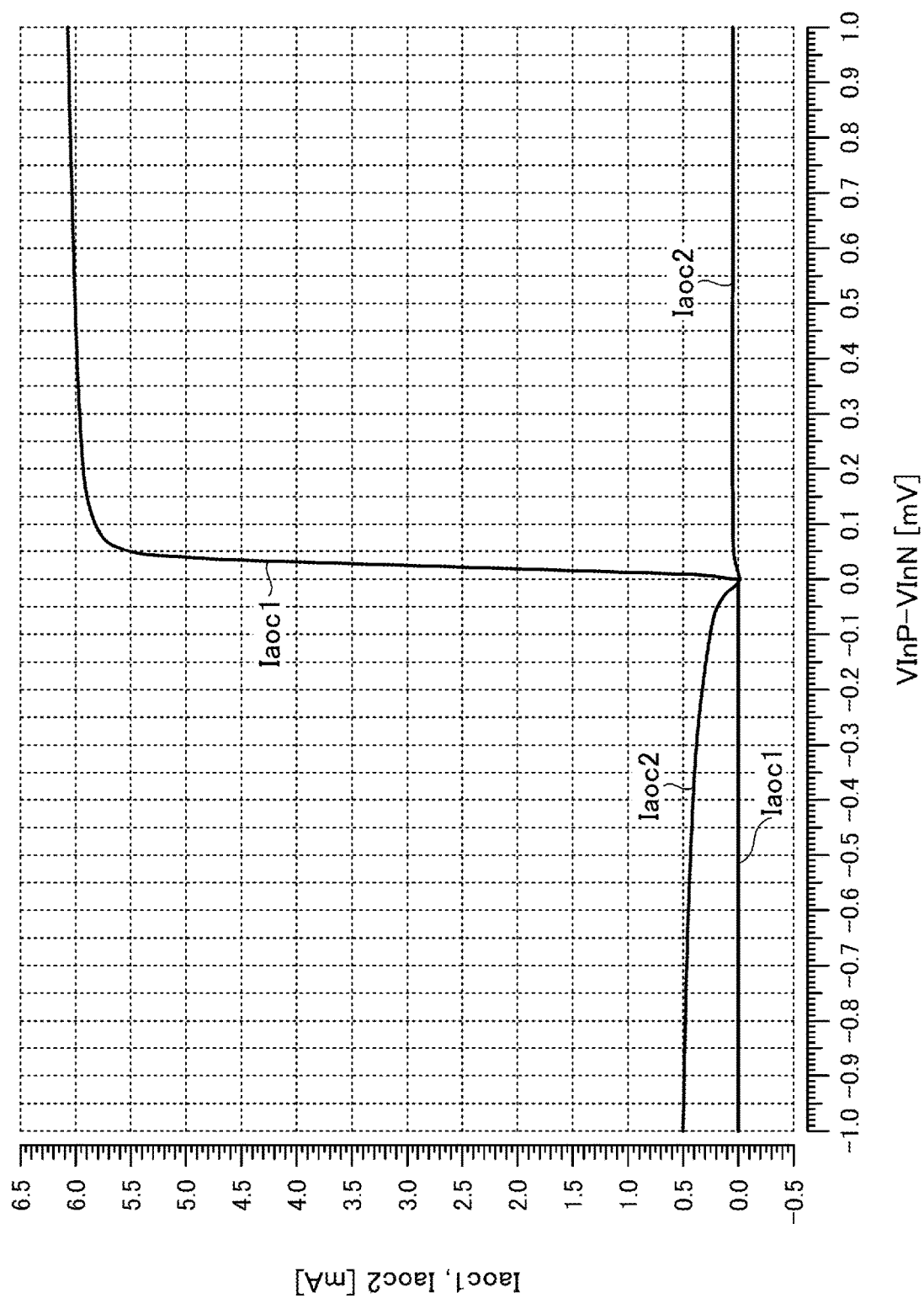
FIG. 4 is a diagram illustrating DC transfer characteristics of the automatic offset control circuit of FIG. 3.

Therefore, the automatic offset control circuit AOC1 can perform the above-described automatic offset control by monitoring the voltage of the differential signal OutP and OutN. That is, the automatic offset control circuit AOC1 can control the feedback current Iaoc1 (equal to or higher than 0 mA) and the feedback current Iaoc2 (equal to or higher than 0 mA) such that the offset of the differential signal OutP and OutN falls within the allowable range. As a result, the buffer circuit BUF can be operated at an appropriate operating point regardless of the magnitude of the input current Iin, and a preferable differential signal OutP and OutN in which the offset is suppressed can be obtained. An example of the circuit configuration of the automatic offset control circuit AOC1 is illustrated in FIG. 3, and an example of the operation of the automatic offset control circuit AOC1 is illustrated in FIG. 4.

When the input current Iin is greater than a predetermined value, a base-collector voltage Vcb of a first stage cascode transistor (Q2 in FIG. 2) can be increased by flowing not only the feedback current Iaoc1 but also the feedback current Iaoc2 with respect to the increase in the input current Iin. Further, by flowing the feedback current Iaoc2, the reference voltage Vref increases with respect to the increase in the input current Iin, and the average voltage value (DC component) of the voltage signal Vtia approaches the reference voltage Vref. Therefore, the voltage value (average value) of the voltage signal Vtia increases compared to a case where the feedback current Iaoc2 is not caused to flow. As a result, the operation margin of the voltage signal circuit (the TIA circuit TIA+the level-shift circuit LS1) when the input current Iin is large can be increased.

The current value of the input current Iin for switching the magnitudes of the feedback currents Iaoc1 and Iaoc2 can be set by adjusting the value of the reference voltage Vref when the feedback current Iaoc2 is 0 mA. For example, the value of the reference voltage Vref when the feedback current Iaoc2 is 0 mA is set to be smaller than the voltage value (average value) of the voltage signal Vtia when the input current Iin is 0 mA. The reference voltage Vref is adjusted by adjusting the current value of the current source ILS2 of the level-shift circuit LS2. For example, the current value of the input current Iin for switching the magnitudes of the feedback currents Iaoc1 and Iaoc2 is denoted by Iswitch.

At this time, the current flowing through the current source ILS2 is set so that the reference voltage Vref becomes equal to "the voltage value (average value) of the voltage signal Vtia when Iin=Iswitch". For example, it is assumed that the reference voltage circuit (the dummy TIA circuit DTIA+the level-shift circuit LS2) has the same electrical characteristics as those of the voltage signal circuit (the TIA circuit TIA+the level-shift circuit LS1), and the resistance values of the resistive elements RLS1 and RLS2 are equal to each other. In this case, the current value of the current source ILS1 is set to be greater than the current value of the current source ILS2. In order to make the electrical characteristics of the reference voltage circuit the same as those of the voltage signal circuit, the reference voltage circuit may have the same circuit configuration as that of the voltage signal circuit, and parameters of circuit elements corresponding to each other in the reference voltage circuit and the voltage signal circuit may be set to the same values.

<Circuit Configuration of TIA Circuit>

Figure 2:
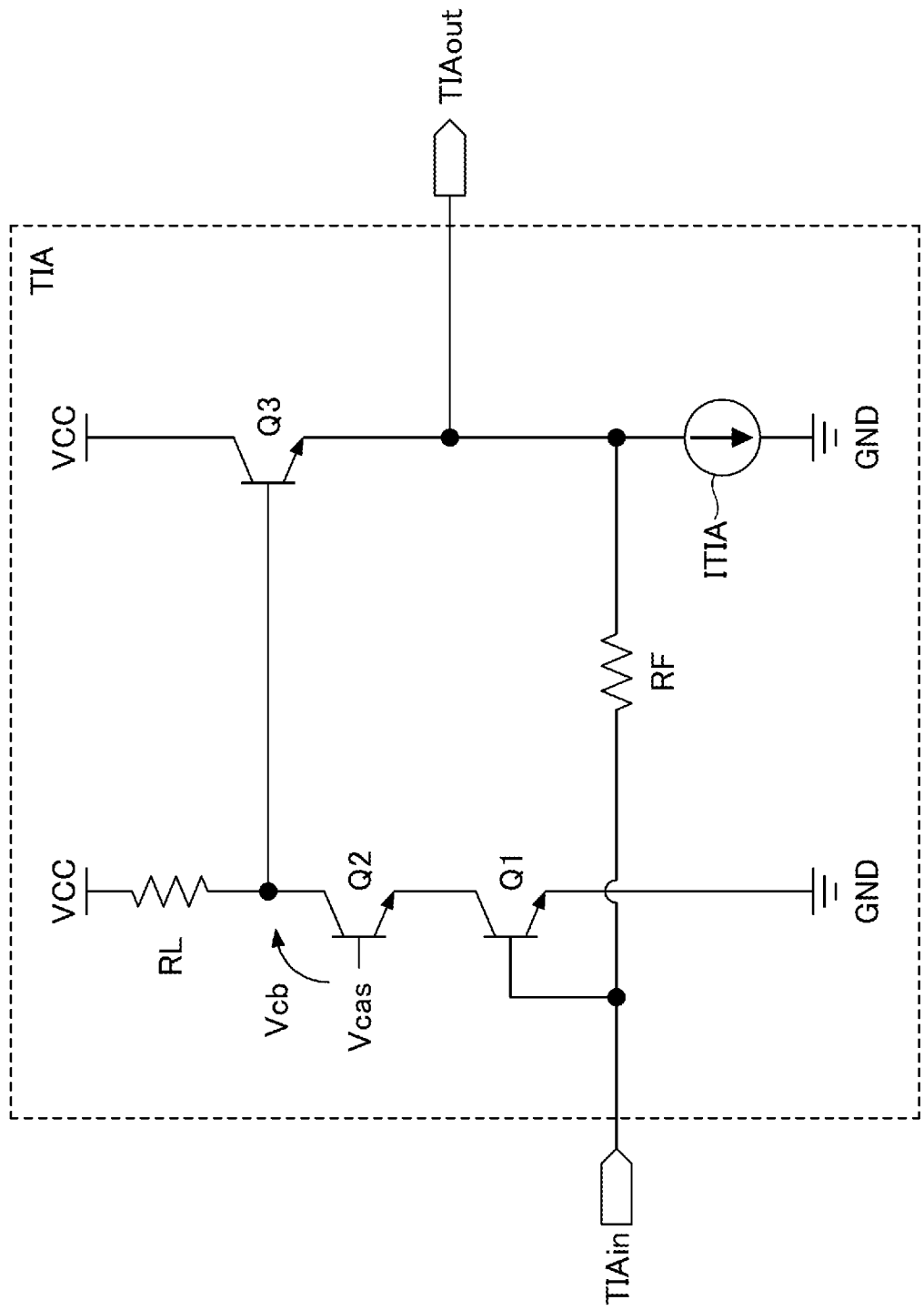
FIG. 2 is a circuit diagram illustrating an example of a transimpedance amplifier (TIA) circuit of FIG. 1.

FIG. 2 is a circuit diagram illustrating an example of the TIA circuit TIA illustrated in FIG. 1. The circuit configuration of the dummy TIA circuit DTIA in FIG. 1 is the same as that in FIG. 2 except that the input current is not input to the input terminal (the input terminal is in an open state). The TIA circuit TIA includes a load resistive element RL, transistors Q2 and Q1 connected in series between the power supply line VCC, and the ground line GND. A base of the transistor Q1 is electrically connected to the input node TIAin, and an emitter of the transistor Q1 is electrically connected to the ground line GND. Therefore, the transistor Q1 is grounded to the emitter. The load resistor RL is electrically connected to the power supply line VCC. The transistor Q2 is electrically connected between the load resistor RL and the transistor Q1. Further, the TIA circuit TIA includes a transistor Q3 and the current source ITIA connected in series between the power supply line VCC and the ground line GND. Further, the TIA circuit TIA includes a feedback resistive element RF connected between the input terminal TIAin and the output terminal TIAout. The feedback resistive element RF corresponds to the resistive element R1 in FIG. 1. In the dummy TIA circuit DTIA, the feedback resistive element RF corresponds to the resistive element R2 in FIG. 1.

The transistor Q2 receives a bias voltage Vcas at its base and operates as a cascode transistor. The bias voltage Vcas is set to a DC voltage. The transistor Q1 has a base connected to the input node TIAin and receives the input current Iin. The emitter of the transistor Q1 is grounded to the ground line GND and the collector of the transistor Q1 is connected to the emitter of the transistor Q2. The transistor Q1 operates as an amplifying transistor. Since a collector voltage of the transistor Q1 is kept at a fixed value in accordance with the bias voltage Vcas even when the transistor Q1 performs amplification operation, the mirror effect of the base-collector capacitance of the transistor Q1 is suppressed. A collector current of the transistor Q1 flows to the resistive element RL via the transistor Q2 to cause a voltage drop. A collector voltage of the transistor Q2 becomes a voltage in accordance with the voltage drop of the resistive element RL with the power supply voltage Vcc as a reference potential. A voltage signal is generated by changing the voltage drop of the resistive element RL in accordance with the collector current of the transistor Q1.

A base of the transistor Q3 is connected to the collector of the transistor Q2, and an emitter of the transistor Q3 is connected to the node TIAout. The transistor Q3 operates as an emitter follower with the current source ITIA. The TIA circuit TIA outputs a voltage obtained by inverting and amplifying a voltage corresponding to the input current Iin received at the input node TIAin from the output node TIAout. The TIA circuit TIA operates as an inverting amplifier. The current source ITIA may be configured by, for example, an n-channel MOS transistor. In order to adjust the current amount, a current mirror circuit including the n-channel MOS transistor may be used. Alternatively, the current source ITIA may be configured using a resistive element instead of the n-channel MOS transistor.

Since the collector of the transistor Q2 is connected to the base of the emitter-follower transistor Q3, the collector voltage of the transistor Q2 has the same polarity as that of the voltage TIAout. That is, the collector voltage of the transistor Q2 is higher than the voltage TIAout by the base-emitter voltage of the transistor Q3 when the ground is used as a reference potential. Therefore, when the voltage TIAout decreases, the collector voltage of the transistor Q2 also decreases, and the base-collector voltage value Vcb of the transistor Q2 decreases. When the voltage TIAout increases, the collector voltage of the transistor Q2 also increases, and the base-collector voltage value Vcb of the transistor Q2 increases. If the base-collector voltage value Vcb becomes small, the operation margin of the transistor Q2 becomes small. Therefore, the base-collector voltage value Vcb is preferably maintained at a predetermined value or more. For example, in order to stably operate the cascode transistor Q2 in a wide band up to a high frequency, it is preferable to reduce the decrease in the base-collector voltage Vcb.

<Circuit Configuration of Automatic Offset Control Circuit>

FIG. 3 is a circuit diagram illustrating an example of the automatic offset control circuit (AOC circuit) AOC1 illustrated in FIG. 1. The automatic offset control circuit AOC1 includes a differential integration circuit D1, p-channel MOS transistors PM1, PM2, PM3, PM4, and, PM5, and n-channel MOS transistors NM1, NM2, NM3, and NM4. The automatic offset control circuit AOC1 includes diodes D1 and D2 and current sources I1 and I2.

The differential integration circuit D1 includes resistive elements R31 and R32, capacitive elements C31 and C32, and an operational amplifier OPA. A first input (non-inverting input terminal) of the operational amplifier OPA is connected to the input InP via the resistive element R31, and a second input (inverting input terminal) of the operational amplifier OPA is connected to the input InN via the resistive element R32. The capacitive element C31 is connected to the first input of the operational amplifier OPA and a second output (inverting output terminal) of the operational amplifier OPA. The second output of the operational amplifier is connected to a control terminal Vaoc1. The capacitive element C32 is connected between the second input of the operational amplifier OPA and a first output of the operational amplifier OPA. The first output of the operational amplifier OPA is connected to the control terminal Vaoc2.

The voltages of the differential signal OutP and OutN are input to the differential integration circuit D1 as input voltages VinP and VinN via the input terminals InP and InN. The differential integration circuit D1 generates control voltages Vaoc1 and Vaoc2 in accordance with the input voltages VinP and VinN. As illustrated in FIG. 4, the automatic offset control circuit AOC1 switches the magnitude relationship between the feedback current Iaoc2 and the feedback current Iaoc1 in accordance with the input voltages VinP and VinN.

The resistive element R31 and the capacitive element C31, and the resistive element R32 and capacitive element C32 each function as an RC filter (i.e., low-pass filter). Then, the differential integration circuit D1 smoothes the input voltages VinP and VinN by the low-pass filter. The operational amplifier OPA operates as a differential integration circuit that differentially amplifies voltage signals obtained by smoothing input voltages VinP and VinN received via the resistive elements R31 and R32, respectively, and outputs the amplified voltage signals as control voltages Vaoc1 and Vaoc2. The difference between the average value (DC voltage) VinPave of the input voltage VinP and the average value (DC voltage) VinNave of the input voltage VinN is amplified. Therefore, the control voltages Vaoc1 and Vaoc2 are generated in accordance with the offset of the differential signal OutP and OutN by the differential integration circuit D1.

For example, when the average value VinPave of the input voltage VinP is greater than the average value VinNave of the input voltage VinN, the control voltage Vaoc1 is smaller than the control voltage Vaoc2. When the average value VinPave of the input voltage VinP is smaller than the average value VinNave of the input voltage VinN, the control voltage Vaoc1 is greater than the control voltage Vaoc2.

That is, when a difference voltage VinPave−VinNave between the average value VinPave of the input voltage VinP and the average value VinNave of the input voltage VinN is positive, the control voltage Vaoc2 generated by the non-inverting amplification operation of the operational amplifier OPA is greater than the control voltage Vaoc1 generated by the inverting amplification operation of the operational amplifier OPA. Further, when the difference voltage VinPave−VinNave is negative, the control voltage Vaoc2 generated by the non-inverting amplification operation of the operational amplifier OPA is smaller than the control voltage Vaoc1 generated by the inverting amplification operation of the operational amplifier OPA. The difference voltage VinPave−VinNave corresponds to an offset of the differential signal OutP and OutN.

The control terminal Vaoc1 is connected to a gate of a transistor NM4 and the current source I1 via a diode D1. Therefore, a voltage obtained by subtracting the voltage drop generated in the diode D1 from the control voltage Vaoc1 is applied to the gate of the transistor NM4.

The control terminal Vaoc2 is connected to a gate of a transistor NM1 and the current source I2 via a diode D2. Therefore, a voltage obtained by subtracting the voltage drop generated in the diode D2 from the control voltage Vaoc2 is applied to the gate of the transistor NM1.

The transistors PM1 and NM1 are connected in series between the power supply line VCC and the ground line GND. Transistors PM2 and NM2 are connected in series between the power supply line VCC and the ground line GND. A transistor PM3 is connected between the power supply line VCC and the feedback current terminal Iaoc2, and the gate thereof is connected to a drain of the transistor NM1. The transistors PM4 and NM4 are connected in series between the power supply line VCC and the ground line GND. In these series connections, the p-channel transistors PM1, PM2, PM3, PM4, and PM5 are connected to the power supply line VCC, and the n-channel transistors NM1, NM2, NM3, and NM4 are connected to the ground line GND.

More specifically, a source of the transistor NM1 is connected to the ground line GND, a drain of the transistor NM1 is connected to a drain of the transistor PM1, and a source of the transistor PM1 is connected to the power supply line VCC. As a result, a drain current of the transistor PM1 becomes equal to a drain current of the transistor NM1.

Since the transistors PM2 and NM2 and the transistors PM4 and NM4 are connected in the same manner as the transistors PM1 and NM1, description thereof will be omitted. Note that a drain current of the transistor NM2 is the same as a drain current of the transistor PM2, and a drain current of the transistor PM4 is the same as a drain current of the transistor NM4.

The transistors PM1, PM2, and PM3 have a source connected in common to the power supply line VCC, a gate connected in common to the drain of the transistor NM1, and operate as a current mirror circuit. That is, the drain currents of the transistors PM2 and PM3 are proportional to the drain current of the transistor PM1. The drain of the transistor PM3 is connected to the feedback current terminal Iaoc2.

The transistors NM2 and NM3 operate as a current mirror circuit, with a source connected in common to the ground line GND and a gate connected in common to the drain of the transistor PM2. That is, the drain current of the transistor NM3 is proportional to the drain current of the transistor NM2. The drain of the transistor NM3 is connected to the feedback current terminal Iaoc1. The transistors PM4 and PM5 have a source connected in common to the power supply line VCC and a gate connected in common to the drain of the transistor NM4, and operate as a current mirror circuit. That is, the drain current of the transistor PM5 is proportional to the drain current of the transistor PM4. The drain of the transistor PM5 is connected to the feedback current terminal Iaoc2.

The transistor NM1 is turned on when the control voltage Vaoc2 is equal to or greater than a predetermined value, and turned off when the control voltage Vaoc2 is smaller than the predetermined value. Regarding the input of the differential integration circuit D1, when the difference voltage VinPave−VinNave between the average value VinPave of the input voltage VinP and the average value VinNave of the input voltage VinN exceeds the predetermined value, the transistor NM1 is turned on, and when the difference voltage VinPave−VinNave is smaller than the predetermined value, the transistor NM1 is turned off.

While the transistor NM1 is turned on, a current flows in a current mirror circuit (first current mirror circuit) formed by the transistors PM1, PM2, and PM3, and a current flows in a current mirror circuit (second current mirror circuit) formed by the transistors NM2 and NM3. As a result, the feedback current Iaoc2 is output from the feedback current terminal Iaoc2, and the feedback current Iaoc1 is drawn from the input terminals In (FIG. 1) via the feedback current terminal Iaoc1.

The transistor NM4 is turned on when the control voltage Vaoc1 is equal to or greater than a predetermined value, and turned off when the control voltage Vaoc1 is smaller than the predetermined value. Regarding the input of the differential integration circuit D1, when the difference voltage VinPave−VinNave between the average value VinPave of the input voltage VinP and the average value VinNave of the input voltage VinN is smaller than the predetermined value, the transistor NM4 is turned on, and when the difference voltage VinPave−VinNave exceeds the predetermined value, the transistor NM4 is turned off. While the transistor NM4 is turned on, a current mirror circuit (third current mirror circuit) formed by the transistors PM4 and PM5 outputs the feedback current Iaoc2 to the reference voltage line Vref (FIG. 1) via the feedback current terminal Iaoc2.

The automatic offset control circuit AOC1 is configured to turn on the transistor NM1 and turn off the transistor NM4 when the average value VinPave of the input voltage VinP is greater than the average value VinNave of the input voltage VinN by adjusting the current amounts of the current sources I1 and I2. In this case, current flows through both the feedback current terminals Iaoc1 and Iaoc2. The automatic offset control circuit AOC1 is configured to turn off the transistor NM1 and turn on the transistor NM4 when the average value VinPave of the input voltage VinP is smaller than the average value VinNave of the input voltage by adjusting the current amounts of the current sources I1 and I2. In this case, the current flows only through the feedback current terminal Iaoc2.

The input terminal InP is connected to the output terminal OutP of the reception circuit 100 in FIG. 1. The input terminal INn is connected to the output terminal OutN of the reception circuit 100. Therefore, when the input current Iin is smaller than a predetermined value and the average voltage value (DC component) of the output signal OutP is smaller than the average voltage value (DC component) of the output signal OutN, a current flows only through the feedback current terminal Iaoc2. When the input current Iin is greater than the predetermined value and the average voltage value (DC component) of the output signal OutP is greater than the average voltage value (DC component) of the output signal OutN, a current flows through both of the feedback current terminals Iaoc1 and Iaoc2.

In this manner, the automatic offset control circuit AOC1 switches the circuits that operate to generate the feedback currents Iaoc1 and Iaoc2 depending on the positive or negative polarity of the differential output (Vaoc1−Vaoc2) of the differential integration circuit D1. The differential integration circuit D1 operates by receiving the differential signal OutP and OutN varying in accordance with the input current Iin at the input terminals InP and InN. That is, the differential integration circuit D1 generates the control voltages Vaoc1 and Vaoc2 in accordance with the input current Iin.

Therefore, the automatic offset control circuit AOC1 can control the generation and switching of the feedback currents Iaoc1 and Iaoc2 in accordance with the control voltages Vaoc1 and Vaoc2 generated by the differential integration circuit D1 in accordance with the input current Iin. In other words, the automatic offset control circuit AOC1 can switch the magnitude relationship between the feedback current Iaoc1 and the feedback current Iaoc2 in accordance with the control voltages Vaoc1 and Vaoc2.

FIG. 4 is a diagram illustrating DC transfer characteristics of the automatic offset control circuit AOC1 illustrated in FIG. 3. FIG. 4 illustrates a result of circuit simulation, in which the horizontal axis represents the difference input voltage VinP−VinN, and the vertical axis represents the feedback currents Iaoc1 and Iaoc2. Reference signals VinP and VinN indicate voltages of the input terminals InP and InN of the automatic offset control circuit AOC1, respectively. The feedback currents Iaoc1 and Iaoc2 have a positive arrow direction illustrated in FIG. 1. In the differential input voltage VinP−VinN illustrated in FIG. 4, the input voltages VinP and VinN are DC voltages. The differential input voltage VinP−VinN on the horizontal axis in FIG. 4 corresponds to the differential voltage VinPave−VinNave described above.

The automatic offset control circuit AOC1 switches the magnitude relationship between the feedback current Iaoc1 and the feedback current Iaoc2 based on the control voltages Vaoc2 and Vaoc1 generated by the differential integration circuit D1 in accordance with the value of the differential input voltage VinP−VinN. For example, when the differential input voltage VinP−VinN is negative, that is, when the average voltage value (DC component) of the output signal OutP is smaller than the average voltage value (DC component) of the output signal OutN, the feedback current Iaoc1 does not flow (0 mA), and only the feedback current Iaoc2 flows. When the differential input voltage VinP−VinN is positive, that is, when the average voltage value (DC component) of the output signal OutP is greater than the average voltage value (DC component) of the output signal OutN, both the feedback currents Iaoc1 and Iaoc2 flow (i.e., Iaoc1>Iaoc2).

There is a region where the feedback currents Iaoc1 and Iaoc2 are both zero in the vicinity of the differential input voltage VinP−VinN of 0 mV. This region is caused by the control voltage Vaoc2 being less than a predetermined value and the control voltage Vaoc1 being less than a predetermined value. The generation and switching of the feedback currents Iaoc1 and Iaoc2 can be stably performed by providing the region where the feedback currents Iaoc1 and Iaoc2 are both zero.

In this manner, the automatic offset control circuit AOC1 can control generation and switching of the feedback currents Iaoc1 and Iaoc2 in accordance with the differential signal OutP and OutN that vary depending on the input current Iin. As a result, the reception circuit 100 having the operation characteristics illustrated in FIG. 5 can be configured, and the increase in the offset of the differential signal OutP and OutN can be suppressed while suppressing noise in the region where the input current Iin is small.

Further, by continuing to flow the feedback current Iaoc2 even after starting to flow the feedback current Iaoc1 by increasing the input current Iin, the operation margin of the voltage signal circuit (the TIA circuit TIA+the level-shift circuit LS1) can be increased. Thus, the TIA circuit TIA can be stably operated in a wide band up to a high frequency.

<Operation Characteristics of Reception Circuit>

Figure 5:
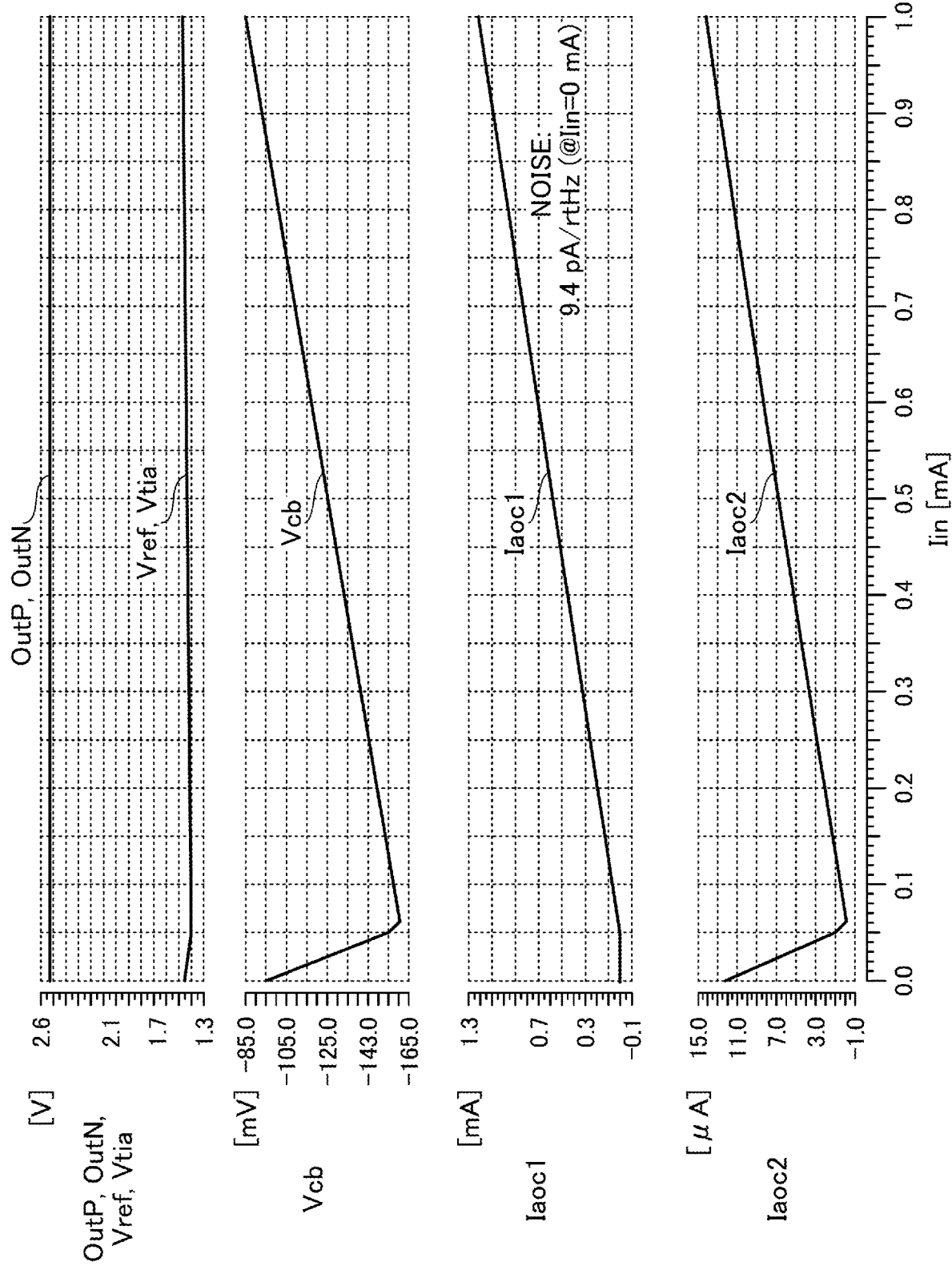
FIG. 5 is a diagram illustrating an example of operation characteristics of the reception circuit illustrated in FIG. 1.
Figure 6:
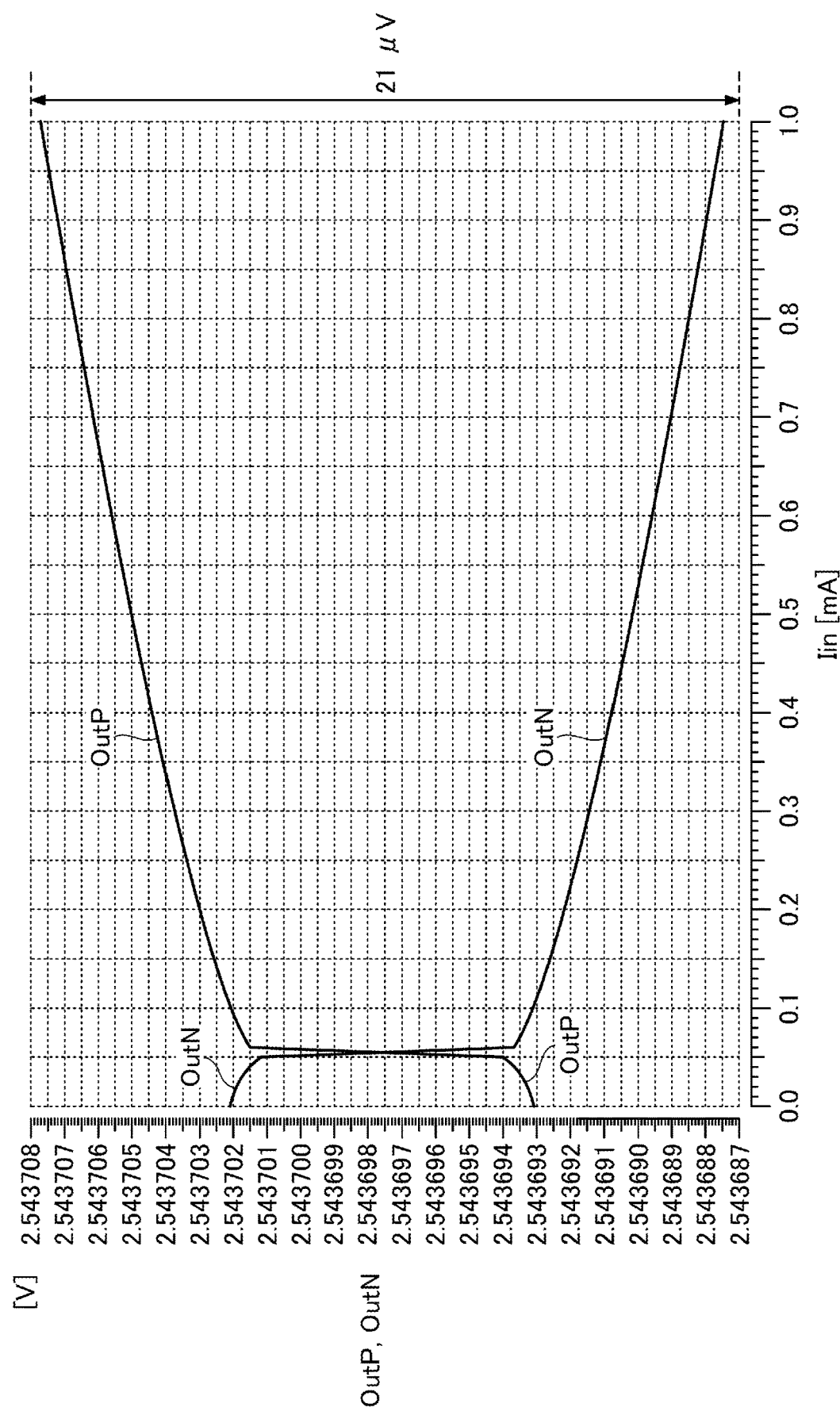
FIG. 6 is an enlarged view of an output voltage of FIG. 5.

FIG. 5 is a diagram illustrating an example of operation characteristics (DC operation characteristics) of the reception circuit 100 illustrated in FIG. 1. FIG. 6 is an enlarged view of the differential signal OutP and OutN of FIG. 5. FIG. 5 and FIG. 6 illustrate the results of circuit simulation. The horizontal axis in FIG. 5 and FIG. 6 represents the input current Iin. The vertical axis in FIG. 5 represents the voltages of the differential signal OutP and OutN, the reference voltage Vref, the voltage signal Vtia, the base-collector voltage Vcb, and the feedback currents Iaoc1 and Iaoc2. The vertical axis in FIG. 6 represents the voltage of the differential signal OutP and OutN. Each value represents an average value (DC component) of the voltage or current.

FIG. 6 illustrates that when the input current Iin is less than 0.06 mA, the positive phase signal OutP becomes smaller than the negative phase signal OutN, and when the input current Iin is greater than 0.06 mA, the positive phase signal OutP becomes greater than the negative phase signal OutN. That is, the automatic offset control circuit AOC1 switches the control of the feedback currents Iaoc1 and Iaoc2 using the input current Iin=0.06 mA as a threshold value.

As a result, the magnitude relationship is changed between the positive phase signal OutP and the negative phase signal OutN.

The threshold value of the input current Iin can be set by setting the voltage value of the reference voltage Vref to be smaller than the voltage value of the voltage signal Vtia when the input current Iin is zero. That is, until the input current Iin increases from zero to a certain degree, the voltage value (DC component) of the voltage signal Vtia becomes greater than the voltage value (DC component) of the reference voltage Vref and the average voltage value of the output signal OutP becomes smaller than the average voltage value of the output signal OutN by the inverting and amplifying operation of the buffer circuit BUF. Further, when the input current Iin increases beyond a certain degree, the voltage value (DC component) of the voltage signal Vtia becomes smaller than the voltage value (DC component) of the reference voltage Vref, and the average voltage value of the output signal OutP becomes greater than the average voltage value of the output signal OutN by the inverting and amplifying operation of the buffer BUF.

The automatic offset control circuit AOC1 illustrated in FIG. 3 sets the feedback current Iaoc1 to 0 mA in a region where the input current Iin is small, and causes the feedback current Iaoc2 to flow to the reference voltage line Vref instead of causing the feedback current Iaoc1 to flow. For example, in FIG. 5, the feedback current Iaoc1 is 0 mA in a region where the input current Iin is approximately 0.06 mA or less. Accordingly, as illustrated in FIG. 5, the offset between the voltage signal Vtia and the reference voltage Vref can be reduced regardless of the magnitude of the input current Iin, and the offset of the differential signal OutP and OutN can be suppressed to be equal to or less than a tolerance of the reception circuit 100.

For example, as illustrated in FIG. 6, the offset of the differential signal OutP and OutN is suppressed to 9 μV or less in a region where the input current Iin is smaller than 0.1 mA, and is suppressed to 21 μV or less in a range where the input current Iin is up to 1.0 mA. In this case, for example, the tolerance of the offset is 50 μV. The tolerance may be determined according to an actual embodiment.

Further, by setting the feedback current Iaoc1 to 0 mA in the region where the input current Iin is small, a noise in the region where the input current Iin is small can be reduced. For example, as illustrated in FIG. 5, when the input current Iin is mA, the noise is 9.4 pA/rtHz. Therefore, the reception circuit 100 illustrated in FIG. 1 can suppress an increase in the offset of the differential signal OutP and OutN while suppressing deterioration of the noise characteristics in the region where the input current Iin is small.

Further, the feedback current Iaoc2 decreases to 0 mA when the control of the automatic offset control circuit AOC1 is switched, and then increases together with the feedback current Iaoc1 in accordance with an increase in the input current Iin. Thus, the base-collector voltage Vcb of the transistor Q2 illustrated in FIG. 2 can be increased in a region where the input current Iin is large, and the operation margin of the voltage signal circuit (the TIA circuit TIA+the level-shift circuit LS1) can be increased.

More specifically, the voltage value of the reference voltage Vref is increased by causing the feedback current Iaoc2 to flow into the level-shift circuit LS2, and the voltage value (average value) of the voltage signal Vtia is brought close to the reference voltage Vref by the action of the automatic offset control circuit AOC1. Therefore, the voltage value (average value) of the voltage signal TIAout increases, and the base-collector voltage Vcb increases. At this time, in order to increase the average value (DC component) of the voltage signal TIAout, the feedback current Iaoc1 slightly increases as compared with the case where the feedback current Iaoc2 does not flow.

As described above, in the present embodiment, the automatic offset control circuit AOC1 sets the feedback current Iaoc1 to 0 mA in a region where the input current Iin value is small, and causes the feedback current Iaoc2 to flow to the reference voltage line Vref instead of causing the feedback current Iaoc1 to flow. As a result, it is possible to suppress an increase in the offset between the voltage signal Vtia and the reference voltage Vref and the offset of the differential signal OutP and OutN while suppressing the noise in the region where the input current Iin is small. At this time, the voltage value of the reference voltage Vref is increased by causing the feedback current Iaoc2 to flow through the resistive element RLS2, and the reference voltage Vref is brought closer to the voltage value of the voltage signal Vtia, whereby the increase in the offset is suppressed.

The voltage signal TIAout output from the inverting amplifier circuit INV1 is level-shifted by the level-shift circuit LS1 and supplied to the buffer circuit BUF, so that the voltage value of the voltage signal TIAout can be set within a voltage range for appropriately operating the buffer circuit BUF. As a result, the buffer circuit BUF can generate an appropriate differential signal OutP and OutN in accordance with the input current Iin.

By adding the feedback current Iaoc2 from the automatic offset control circuit AOC1 to the current from the current source ILS2 and causing it to flow through the resistive element RLS2, the reference voltage Vref can be adjusted, and the average value of the voltage signal Vtia is brought close to the reference voltage Vref, so that the increase in the offset of the differential signal OutP and OutN can be suppressed.

By configuring the dummy TIA circuit DTIA with the same circuit elements as the TIA circuit TIA, the circuit design of the reception circuit 100 can be simplified.

As illustrated in FIG. 4, the automatic offset control circuit AOC1 switches the magnitude relationship between the feedback current Iaoc2 and the feedback current Iaoc1 in accordance with the differential input voltage VinP−VinN. As a result, the reception circuit 100 having the operation characteristics illustrated in FIG. 5 can be configured. That is, the increase in the offset of the differential signal OutP and OutN can be suppressed while suppressing the noise in the region where the input current Iin is small.

When the input current Iin exceeds a predetermined threshold value, the reference voltage Vref becomes greater than the voltage value (average value) of the voltage signal Vtia, so that the average value of the voltage signal Vtia can be brought close to the reference voltage Vref in accordance with the extraction of the feedback current Iaoc1. As a result, the automatic offset control circuit AOC1 can perform automatic offset control for suppressing the increase in the offset of the differential signal OutP and OutN.

By integrating the circuits of the reception circuit 100 into a single semiconductor IC chip, it is possible to reduce the influence of variations in the electrical characteristics of the TIA circuit TIA and the dummy TIA circuit DTIA, or to reduce the influence of variations in the electrical characteristics of the level-shift circuits LS1 and LS2. For example, when the dummy TIA circuit DTIA and the TIA circuit TIA are configured by the same circuit elements, the power supply voltage voltage dependency (or temperature dependency) of the electrical characteristics of the dummy TIA circuit DTIA can be made similar to the power supply voltage dependency (or temperature dependency) of the electrical characteristics of the TIA circuit TIA, and the reception circuit 100 can be more stably operated with respect to variations in the power supply voltage (or variations in temperature). As a result, the accuracy of adjustment of the offset adjustment of the differential signal OutP and OutN by the automatic offset control circuit AOC1 can be improved.

Second Embodiment

<Circuit Configuration of Automatic Offset Control Circuit Mounted on Reception Circuit>

Figure 7:
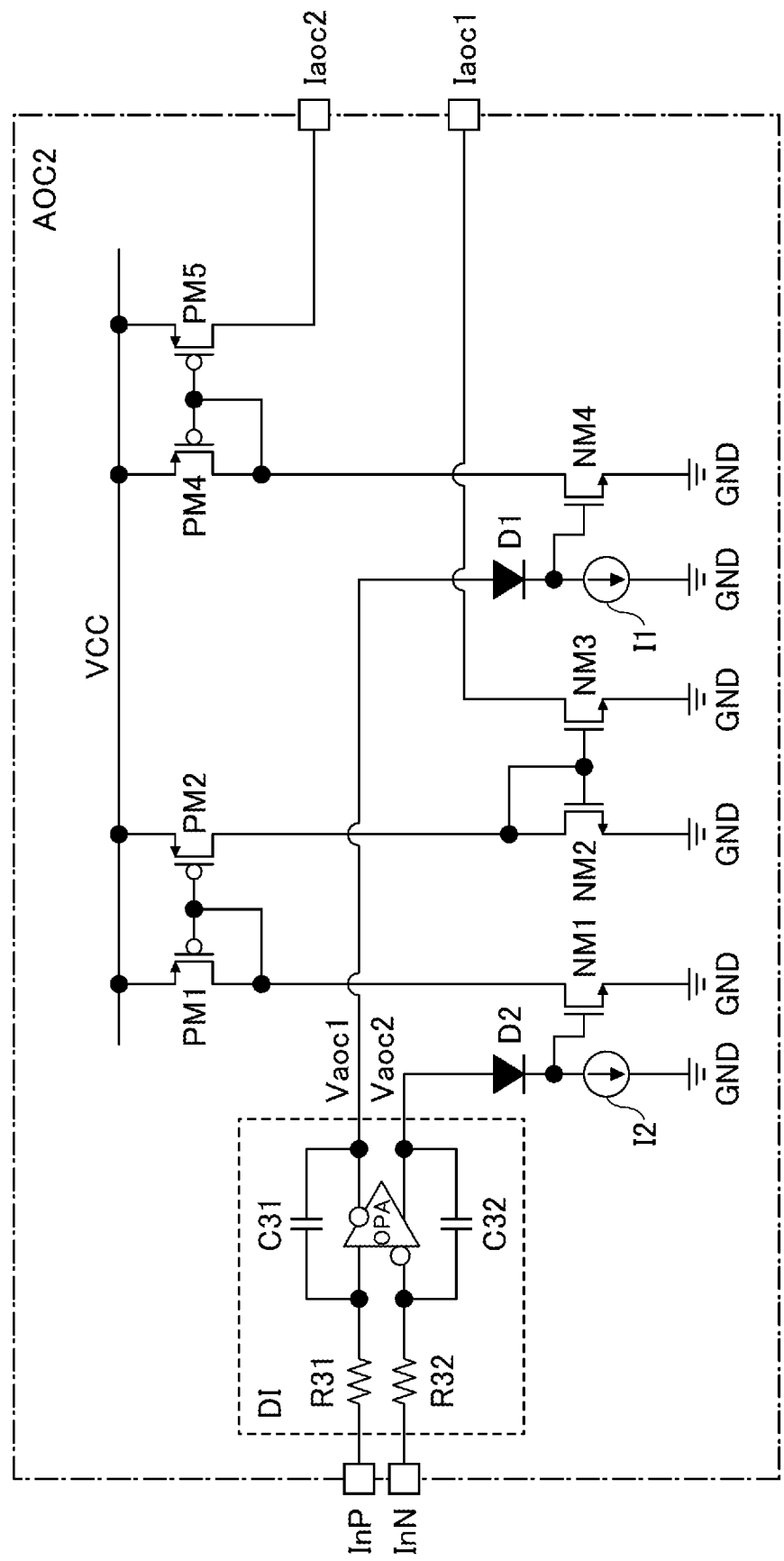
FIG. 7 is a circuit diagram illustrating an example of an automatic offset control circuit mounted in a reception circuit according to a second embodiment.

FIG. 7 is a circuit diagram illustrating an example of an automatic offset control circuit AOC2 mounted on a reception circuit according to the second embodiment. The reception circuit on which the automatic offset control circuit AOC2 of FIG. 7 is mounted is the same as the reception circuit 100 illustrated in FIG. 1 except for the configuration of the automatic offset control circuit AOC2. That is, the reception circuit of the present embodiment is included in an optical receiver or the like, amplifies an input current Iin received from a photodiode, converts the input current Iin into a voltage signal, and outputs a differential signal OutP and OutN.

The automatic offset control circuit AOC2 of FIG. 7 is configured by removing the transistor PM3 from the automatic offset control circuit AOC1 of FIG. 3. Since there is no transistor PM3, when an average value VinPave of an input voltage VinP is greater than an average value VinNave of an input voltage VinN and a control voltage Vaoc1 is smaller than a control voltage Vaoc2, the automatic offset control circuit AOC2 does not flow a feedback current Iaoc2 but flows only a feedback current Iaoc1. Other operations of the automatic offset control circuit AOC2 are the same as those of the automatic offset control circuit AOC1 of FIG. 3.

That is, the automatic offset control circuit AOC2 of the present embodiment switches the circuit operation so that only the feedback current Iaoc2 flows when the input current Iin is smaller than a predetermined value, and only the feedback current Iaoc1 flows when the input current Iin is greater than the predetermined value.

For example, when the input current Iin is large and the operation margin of the voltage signal circuit (the TIA circuit TIA+the level-shift circuit LS1) is sufficient, the automatic offset control circuit AOC1 can be configured by removing the transistor PM3 from the automatic offset control circuit AOC2 of FIG. 3. For example, when the input current Iin increases, a voltage value (average value) of a voltage signal TIAout output from a TIA circuit TIA decreases. However, in a case where the TIA circuit TIA can perform a predetermined amplification operation with respect to such a decrease in the voltage value (average value) of the voltage signal TIAout, only the feedback current Iaoc1 may be caused to flow when the input current Iin is greater than the predetermined value. In this case, a circuit scale of the reception circuit including the automatic offset control circuit AOC2 can be reduced.

As described above, also in the present embodiment, the same effects as those of the above-described embodiment can be obtained. For example, it is possible to suppress the increase in the offset between the voltage signal Vtia and the reference voltage Vref and the offset of the differential signal OutP and OutN while suppressing the noise in the region where the input current Iin is small.

Further, in the present embodiment, when the input current Iin is greater than a predetermined value and the operation margin of the voltage signal circuit (the TIA circuit TIA+the level-shift circuit LS1) is sufficient, the automatic offset control circuit AOC2 can be simplified as compared with the automatic offset control circuit AOC1 illustrated in FIG. 3. As a result, the circuit scale of the reception circuit including the automatic offset control circuit AOC2 can be reduced.

<Circuit Configuration of Another Reception Circuit>

Figure 8:
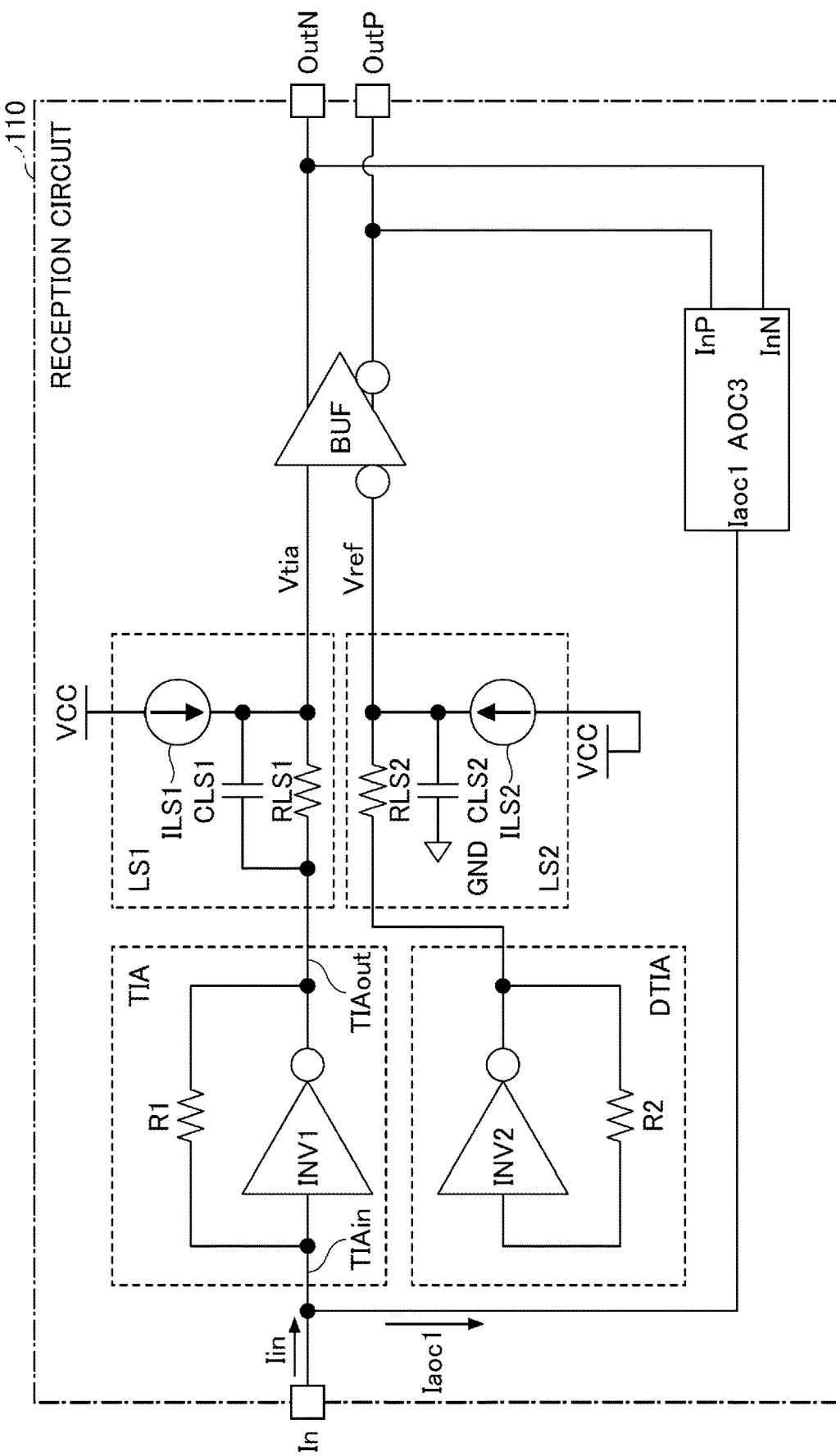
FIG. 8 is a block diagram illustrating an example of another reception circuit.

FIG. 8 is a block diagram illustrating an example (comparative example) of another reception circuit. The same components as those of the reception circuit 100 in FIG. 1 are denoted by the same reference numerals, and detailed description thereof will be omitted. The reception circuit 110 of FIG. 8 includes an automatic offset control circuit AOC3 instead of the automatic offset control circuit AOC1 of the reception circuit 100 of FIG. 1.

Other configurations of the reception circuit 110 are the same as those of the reception circuit 100 of FIG. 1 except that the automatic offset control circuit AOC3 does not have a function of outputting the feedback current Iaoc2 to the reference voltage line Vref. Similar to the automatic offset control circuit AOC1 illustrated in FIG. 1, the automatic offset control circuit AOC3 has a function of extracting the feedback current Iaoc1 from the input terminals In in accordance with the offset of the differential signal OutP and OutN.

Figure 9:
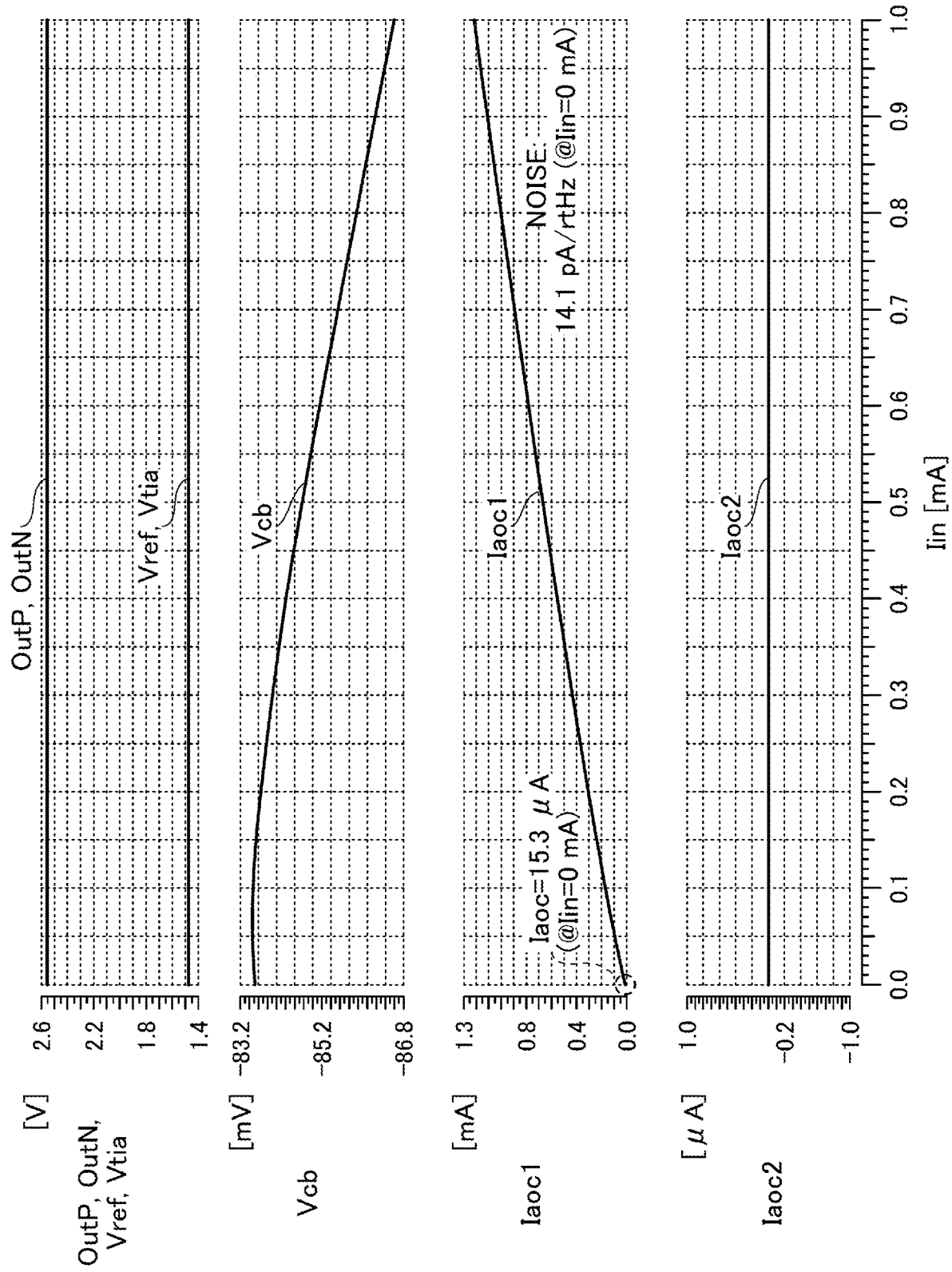
FIG. 9 is a diagram illustrating an example of operation characteristics of the reception circuit illustrated in FIG. 8.

FIG. 9 is a diagram illustrating an example of operation characteristics (DC operation characteristics) of the reception circuit 110 illustrated in FIG. 8. FIG. 9 illustrates the results of circuit simulation. The horizontal axis of FIG. 9 represents the input current Iin. The vertical axis in FIG. 9 represents the voltages of the differential signal OutP and OutN, the reference voltage Vref, the voltage signal Vtia, the base-collector voltage Vcb, and the feedback current Iaoc1. Each value represents an average value (DC component) of the voltage or current. Further, since the feedback current Iaoc2 does not flow in the reception circuit 110, the feedback current Iaoc2 (0 mA) is illustrated for reference.

As illustrated in FIG. 9, due to the operation of the automatic offset control circuit AOC3, the feedback current Iaoc1 increases as the input current Iin increases. Therefore, the offset of the differential signal OutP and OutN is suppressed to be small regardless of the magnitude of the input current Iin similarly to the operation of the reception circuit 100 illustrated in FIG. 5. As a result, the amplifier in each stage in the buffer circuit BUF has an appropriate operating point, and a preferable amplifying operation can be performed. However, in order to perform an automatic offset control by the automatic offset control circuit AOC3, the feedback current Iaoc1 is required to flow even when Iin=0 mA, which may deteriorate the noise characteristics.

In the example shown in FIG. 9, the feedback current Iaoc1 flowing when the input current Iin=0 mA is 15.3 µA, and the noise at this time is 14.1 pA/rtHz, which is greater than the noise (9.4 pA/rtHz) described in FIG. 5.

Figure 10:
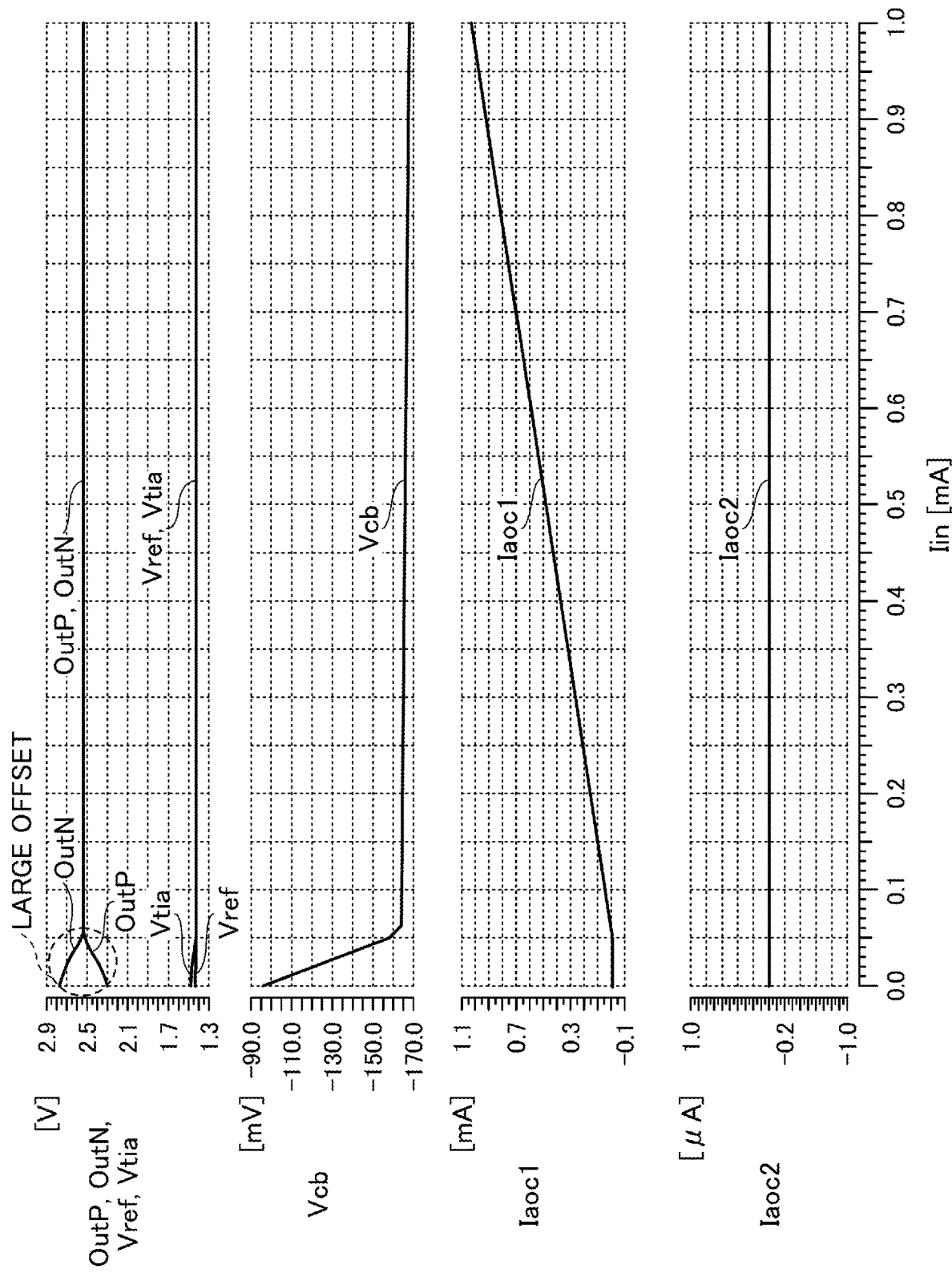
FIG. 10 is a diagram illustrating another example of the operation characteristics of the reception circuit of FIG. 8.

FIG. 10 is a diagram illustrating another example of the operation characteristics of the reception circuit 110 illustrated in FIG. 8. In the example illustrated in FIG. 10, in order to reduce noise by preventing the feedback current Iaoc1 from flowing in the region where the input current Iin is small, the circuit characteristics of the reception circuit 110 are set such that the reference voltage Vref when the input current Iin is 0 mA is lower than the average value of the voltage signal Vtia.

In this case, in the region where the value of the input current Iin is small, the feedback current Iaoc1 is 0 mA, but a large offset occurs in the differential signal OutP and OutN, and a preferable amplification characteristic cannot be expected. Until the operation of the automatic offset control circuit AOC3 is started and the feedback current Iaoc1 starts to flow, the reference voltage Vref becomes lower than the average value of the voltage signal Vtia. Since the reference voltage Vref is constant, even after the feedback current Iaoc1 starts flowing, the average value (DC component) of the voltage signal Vtia gradually decreases at a value smaller than the reference voltage Vref, and the base-collector voltage value Vcb of the first stage cascode transistor (FIG. 2) of the TIA circuit TIA decreases. Therefore, as compared with FIG. 5 and FIG. 9, the operation margin decreases as the input current Iin increases.

Third Embodiment

<Circuit Configuration of Reception Circuit>

Figure 11:
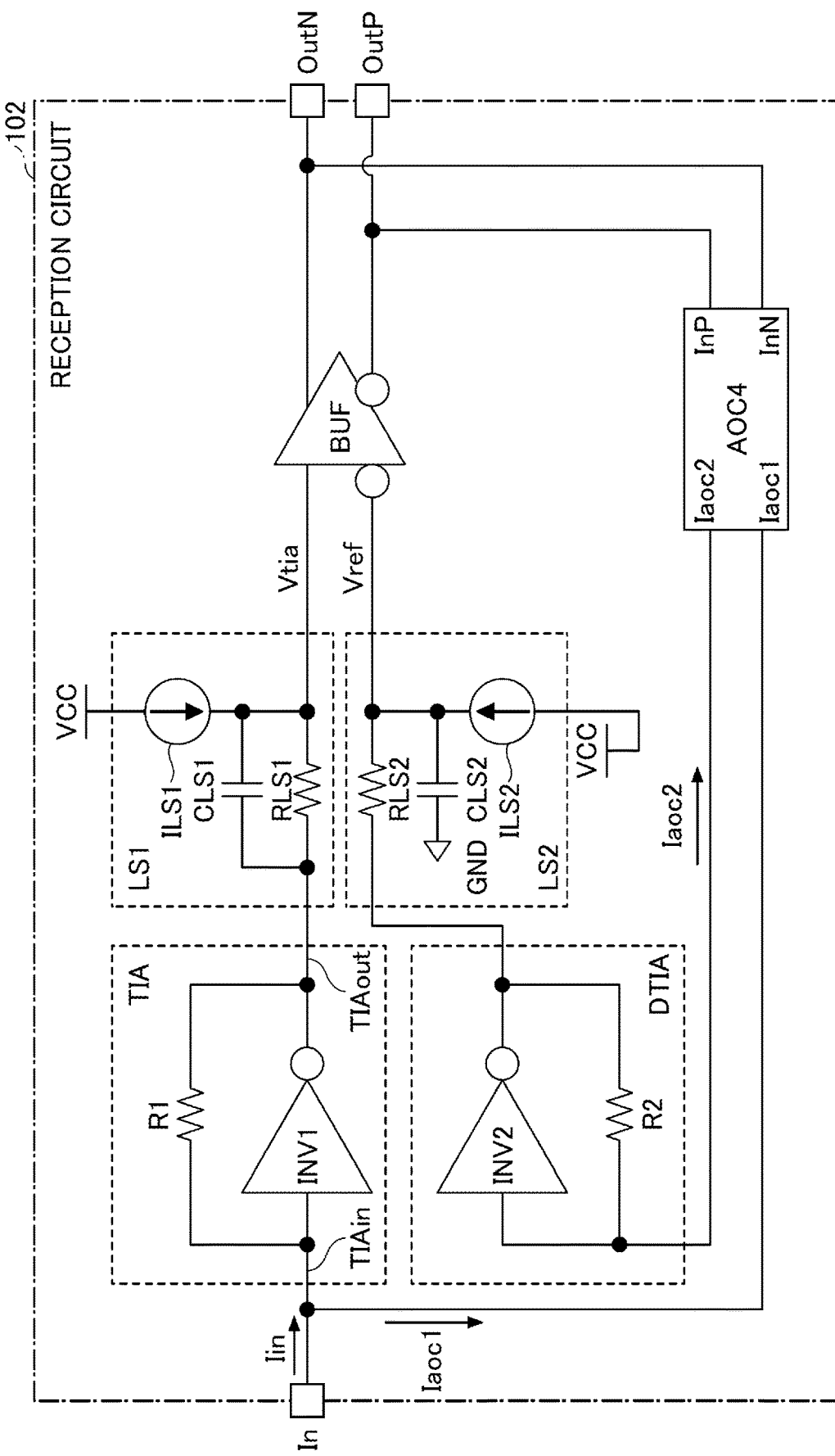
FIG. 11 is a block diagram illustrating an example of a reception circuit according to a third embodiment.

FIG. 11 is a block diagram illustrating an example of a reception circuit according to a third embodiment. The same components as those of the reception circuit 100 in FIG. 1 are denoted by the same reference numerals, and detailed description thereof will be omitted. A reception circuit 102 of FIG. 11 has the same configuration as the reception circuit 100 of FIG. 1 except that the reception circuit 102 includes an automatic offset control circuit AOC4 instead of the automatic offset control circuit AOC1. For example, the reception circuit 102 is formed by integrating each circuit element into a single semiconductor integrated circuit chip.

In the present embodiment, a feedback current terminal Iaoc2 of the automatic offset control circuit AOC4 is connected to an input of an inverting amplifier circuit INV2 of a dummy TIA circuit DTIA. The reception circuit 102 is included in an optical receiver or the like, amplifies an input current Iin received from a photodiode, converts the input current Iin into a voltage signal, and outputs a differential signal OutP and OutN.

The automatic offset control circuit AOC4 is different from the automatic offset control circuit AOC1 of FIG. 1 in that the automatic offset control circuit AOC4 has a function of drawing the feedback current Iaoc2 from an input node of the dummy TIA circuit DTIA. The other configuration of the reception circuit 102 is the same as that of the reception circuit 100 of FIG. 1 except that the feedback current terminal Iaoc2 of the automatic offset control circuit AOC4 is connected to the input of the inverting amplifier circuit INV2 of the dummy TIA circuit DTIA. In FIG. 11, similarly to FIG. 1, the feedback currents Iaoc1 and Iaoc2 have positive arrow directions.

Figure 12:
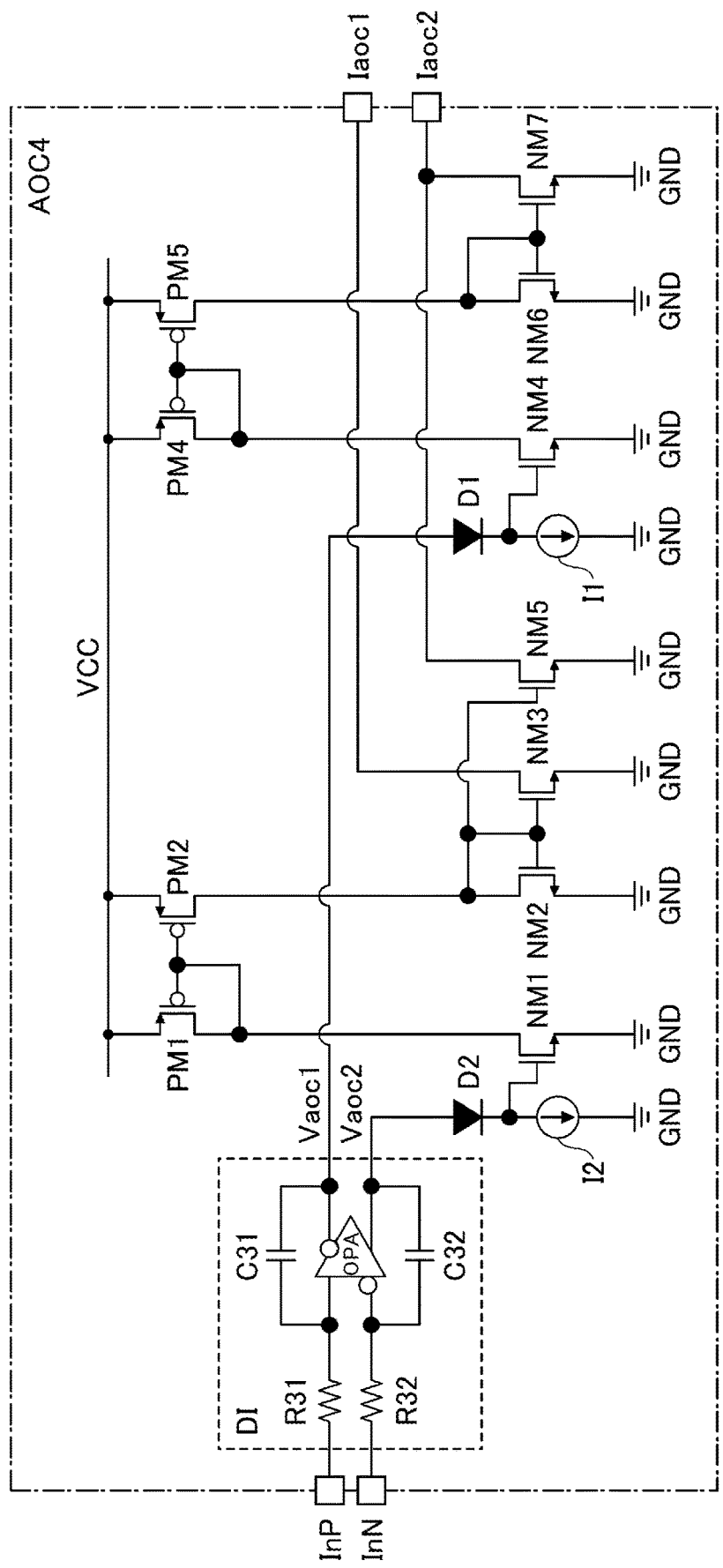
FIG. 12 is a circuit diagram illustrating an example of an automatic offset control circuit of FIG. 11.

FIG. 12 is a circuit diagram illustrating an example of the automatic offset control circuit AOC4 of FIG. 11. The same elements as those of the automatic offset control circuit AOC1 in FIG. 3 are denoted by the same reference numerals, and detailed description thereof will be omitted. In order to draw the feedback current Iaoc2 from the input of the inverting amplifier circuit INV2, the automatic offset control circuit AOC4 is modified from the automatic offset control circuit AOC1 illustrated in FIG. 3. Specifically, in the automatic offset control circuit AOC4, the transistor PM3 is deleted from the automatic offset control circuit AOC1 of FIG. 3, and transistors NM5, NM6, and NM7 are added. The transistors NM5, NM6, NM7 are n-channel MOS transistors.

The transistor NM5 includes a source connected to a ground line GND, a drain connected to the feedback current terminal Iaoc2, and a gate connected to a drain of the transistor PM2. The transistors NM2 and NM5 operate as a current mirror circuit similarly to the transistors NM2 and NM3. That is, a drain current of the transistor NM5 is proportional to a drain current of the transistor NM2. The transistors NM6 and NM7 include a source connected in common to the ground line GND and a gate connected in common to the drain of the transistor PM5, and operate as a current mirror circuit. That is, a drain current of the transistor NM7 is proportional to a drain current of the transistor NM6. A drain of the transistor NM6 is connected to a drain of the transistor PM5. A drain of the transistor NM7 is connected to the feedback current terminal Iaoc2. A drain current of the transistor NM6 becomes the same as the drain current of the transistor PM5.

When an average value VinPave of an input voltage VinP is greater than an average value VinNave of an input voltage VinN, the automatic offset control circuit AOC4 turns on the transistor NM1 and turns off the transistor NM4 to adjust current sources I1 and I2 so that a current flows through both the feedback current terminals Iaoc1 and Iaoc2. Further, when the average value VinPave of the input voltage VinP is smaller than the average value VinNave of the input voltage VinN, the automatic offset control circuit AOC4 turns off the transistor NM1 and turns on the transistor NM4 to adjust current sources I1 and I2 so that a current flows only to the feedback current terminals Iaoc2.

The input terminal InP is connected to the output terminal OutP of the reception circuit 102 illustrated in FIG. 11. The input terminal InN is connected to the output terminal OutN of the reception circuit 102 illustrated in FIG. 11. Therefore, when the average voltage value of the output signal OutP is greater than the average voltage value of the output signal OutN, a current flows through both the feedback current terminals Iaoc1 and Iaoc2. When the average voltage value of the output signal OutP is smaller than the average voltage value of the output signal OutN, a current flows only to the feedback current terminal Iaoc2.

For example, in the reception circuit 100 of FIG. 1, the automatic offset control circuit AOC1 increases the reference voltage Vref by causing the feedback current Iaoc2 to flow into the level-shift circuit LS2 via the reference voltage line Vref. In the reception circuit 102 of FIG. 11, the automatic offset control circuit AOC4 draws the feedback current Iaoc2 from the input node of the dummy TIA circuit DTIA (i.e., reduces the input current) to increase the output voltage of the dummy TIA circuit DTIA, thereby increasing the reference voltage Vref. Therefore, the reference voltage Vref can be increased by the automatic offset control circuit AOC4 drawing the feedback current Iaoc2 in accordance with the offset of the differential signal OutP and OutN, in the same way that the automatic offset control circuit AOC1 flows the feedback current Iaoc2 in accordance with the offset of the differential signal OutP and OutN.

The operation characteristics of the reception circuit 102 illustrated in FIG. 11 are the same as those of the reception circuit 100 illustrated in FIG. 5 and FIG. 6 except that the direction in which the feedback current Iaoc2 flows is opposite. That is, the reception circuit 102 can suppress an increase in the offset of the differential signal OutP and OutN while suppressing the deterioration of the noise characteristics in the region where the input current Iin is small.

As described above, also in the present embodiment, the same effects as those of the above-described embodiments can be obtained. For example, it is possible to suppress the increase in the offset between the voltage signal Vtia and the reference voltage Vref and the offset of the differential signal OutP and OutN while suppressing the deterioration of noise characteristics in the region where the input current Iin is small.

Further, in the present embodiment, the automatic offset control circuit AOC4 draws the feedback current Iaoc2 from the input node of the inverting amplifier circuit INV2. Thus, by adjusting the input current of the inverting amplifier circuit INV2, the reference voltage Vref applied to the buffer circuit BUF can be adjusted to suppress the increase in the offset of the differential signal OutP and OutN.

Note that the transistor NM5 may be removed from the automatic offset control circuit AOC4 illustrated in FIG. 12, and a current may be caused to flow only through the feedback current terminal Iaoc1 when the average voltage value of the signal OutP is greater than the average voltage value of the signal OutN.

Fourth Embodiment

<Circuit Configuration of Reception Circuit>

Figure 13:
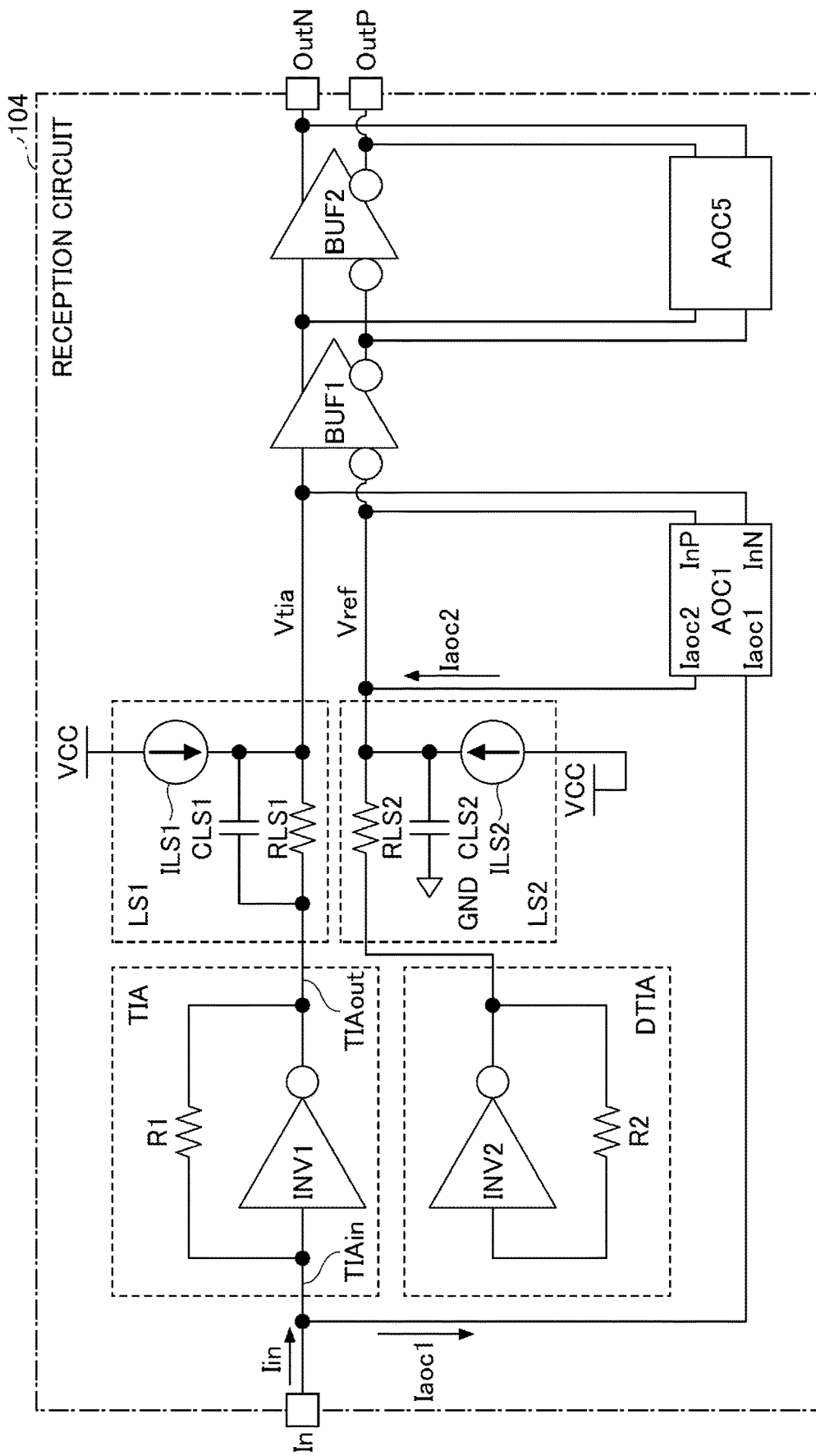
FIG. 13 is a block diagram illustrating an example of a reception circuit according to a fourth embodiment.

FIG. 13 is a block diagram illustrating an example of a reception circuit according to a fourth embodiment. The same components as those of the reception circuit 100 in FIG. 1 are denoted by the same reference numerals, and detailed description thereof will be omitted. In the reception circuit 104 of FIG. 13, a buffer circuit BUF2 is arranged between the buffer circuit BUF1 and the terminals OutP and OutN, and an automatic offset control circuit AOC5 is connected to the outputs and inputs of the buffer circuit BUF2. For example, the reception circuit 104 is formed by integrating each circuit element into a single semiconductor integrated circuit chip.

In the present embodiment, input terminals InP and InN of an automatic offset control circuit AOC1 are connected to nodes Vref and Vtia, respectively. That is, the automatic offset control circuit AOC1 subtracts a feedback current Iaoc1 from an input current Iin or outputs a feedback current Iaoc2 to a reference voltage line Vref in accordance with a voltage difference between the respective average voltages of the nodes Vref and Vtia received at the input terminals InP and InN. Then, the automatic offset control circuit AOC1 performs automatic offset control for suppressing an increase in the offset between the voltage signal Vtia and the reference voltage Vref.

The automatic offset control circuit AOC5 adjusts the average voltage value of the difference signal supplied to the difference input of the buffer circuit BUF2 in accordance with the differential signal OutP and OutN, thereby suppressing an increase in the offset of the differential signal OutP and OutN. For example, in a region where the automatic offset control circuit AOC1 is not in operation, an offset is generated between the voltage signal Vtia and the reference voltage Vref. However, the offset of the differential signal OutP and OutN caused by the offset between the voltage signal Vtia and the reference voltage Vref can be cancelled by the automatic offset control circuit AOC5, and an increase in the offset of the differential signal OutP and OutN can be suppressed. As a result, better amplification characteristics can be obtained.

As described above, also in the present embodiment, the same effects as those of the above-described embodiments can be obtained. For example, in the present embodiment, the input terminals InP and InN of the automatic offset control circuit AOC1 operate by receiving the voltages of the nodes Vref and Vtia. Also in this case, the reception circuit 104 can suppress the increase in the offset between the voltage signal Vtia and the reference voltage Vref and the offset of the differential signal OutP and OutN while suppressing the noise in the region where the input current Iin is small.

Further, the reception circuit 104 includes the automatic offset control circuit AOC5 that connects the outputs and inputs of the buffer circuit BUF2 arranged between the buffer circuit BUF1 and the output terminals OutP and OutN. Therefore, even in the region where the automatic offset control circuit AOC1 is not in operation, the increase in the offset of the differential signal OutP and OutN can be suppressed by the automatic offset control circuit AOC5, and better amplification characteristics can be obtained.

The reception circuit 104 may include the automatic offset control circuit AOC2 illustrated in FIG. 7 instead of the automatic offset control circuit AOC1.

Fifth Embodiment

<Circuit Configuration of Reception Circuit>

Figure 14:
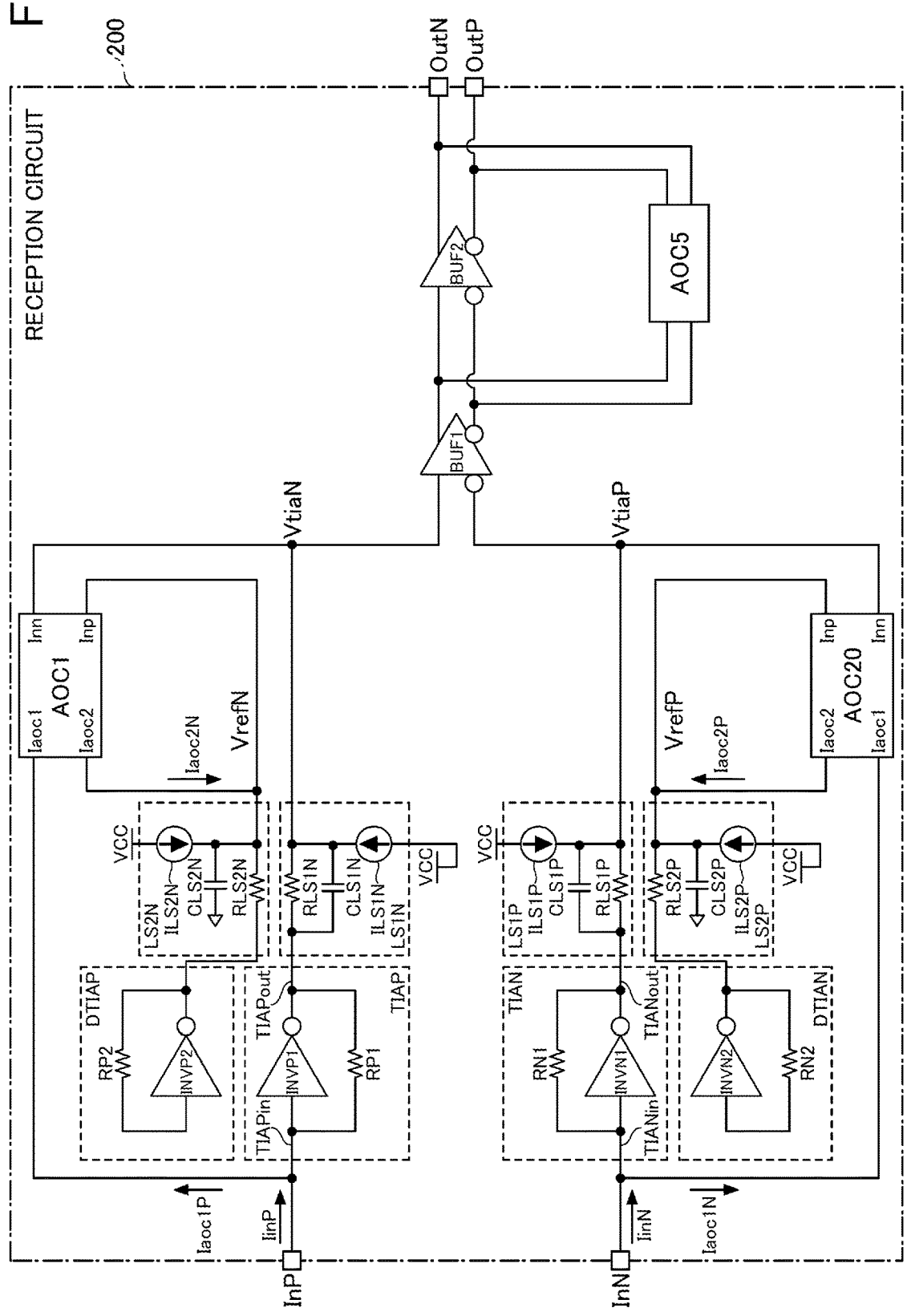
FIG. 14 is a block diagram illustrating an example of a reception circuit according to a fifth embodiment.

FIG. 14 is a block diagram illustrating an example of a configuration of a reception circuit according to a fifth embodiment. For example, a reception circuit 200 illustrated in FIG. 14 is included in an optical receiver or the like that receives an optical signal. The reception circuit 200 includes input terminals InP and InN that receive a pair of input currents IinP and IinN, and output terminals OutN and OutP that output voltage signals amplified in accordance with the pair of input currents IinP and IinN as a differential signal OutN and outP.

For example, an optical receiver used in a digital coherent optical communication system generates a pair of optical signals orthogonal to each other by interfering received light transmitted by an optical fiber cable with local light emission generated in the optical receiver, and inputs the generated pair of optical signals to a pair of light receiving elements to generate a pair of current signals. The input terminals InP and InN of the reception circuit 200 can receive such a pair of current signals as a pair of input currents IinP and IinN. The pair of input currents IinP, and IinN may be differential input signals. The reception circuit 200 outputs a voltage signal as the differential signal OutN and OutP. The differential signal OutN and OutP includes a pair of output signals OutP and OutN.

If an offset compensation is not performed, for example, the reception circuit 200 decreases the voltage value (DC component) of the output signal OutN when the average value (DC component) of the input current IinP increases, and increases the voltage value (DC component) of the output signal OutN when the average value (DC component) of the input current IinP decreases. When the offset compensation is not performed, the reception circuit 200 decreases the voltage value (DC component) of the output signal OutP when the average value (DC component) of the input current IinN increases, and increases the voltage value (DC component) of the output signal OutN when the average value (DC component) of the input current IinN decreases.

Accordingly, the reception circuit 200 increases a voltage difference in the differential signal OutP and OutN when the average value of the difference between the input currents IinP and IinN increases, and decreases the voltage difference in the differential signal OutP and OutN when the average value of the difference between the input currents IinP and IinN decreases. More specifically, the reception circuit 200 reduces the difference between the voltage value (DC component) of the output signal OutP and the voltage value (DC component) of the output signal OutN by performing the offset compensation. The offset represents the difference between the voltage value (DC component) of the output signal OutP and the voltage value (DC component) of the output signal OutN.

For example, when the amplitudes of the signal components of the differential input currents IinP and IinN increase, the amplitudes of the signal components of the differential signal OutP and OutN also increase. The differential signal OutP and OutN output from the output terminals OutP and OutN are output to a signal processing circuit such as a DSP and processed.

The reception circuit 200 includes, for example, a TIA circuit TIAP, a level-shift circuit LS1N, a dummy TIA circuit DTIAP, a level-shift circuit LS2N, and an automatic offset control circuit AOC1. Further, the reception circuit 200 includes, for example, a TIA circuit TIAN, a level-shift circuit LS1P, a dummy TIA circuit DTIAN, a level-shift circuit LS2P, and an automatic offset control circuit AOC20. Further, the reception circuit 200 includes buffer circuits BUF1 and BUF2 and an automatic offset control circuit AOC5.

For example, each circuit of the reception circuit 200 is integrated into a single semiconductor integrated circuit chip. This enables to reduce variations in electrical characteristics among a plurality of circuits formed using the same circuit element. For example, by making the dummy TIA circuit DTIAP have the same circuit configuration as that of the TIA circuit TIAP, it is possible to reduce the influence of variations of the respective electrical characteristics on the reception circuit 200. Further, by making the level-shift circuit LS2N have the same circuit configuration as that of the level-shift circuit LS1N, it is possible to reduce the influence of variations in the respective electrical characteristics. As a result, the accuracy of adjustment of the offset between the average value of the voltage signal VtiaN and the reference voltage VrefN by the automatic offset control circuit AOC1 can be improved.

By making the dummy TIA circuit DTIAP have the same circuit configuration as that of the TIA circuit TIAP, it can be expected that the dummy TIA circuit DTIAP has the same electrical characteristics as those of the TIA circuit TIAP. Further, by making the dummy TIA circuit DTIAN have the same circuit configuration as that of the TIA circuit TIAN, it can be expected that the dummy TIA circuit DTIAN has the same electrical characteristics as those of the TIA circuit TIAN.

Furthermore, the TIA circuits TIAP and TIAN and the dummy TIA circuits DTIAP and DTIAN may have the same circuit configuration. The level-shift circuit LS2N may have the same circuit configuration as that of the level-shift circuit LS1N so that the level-shift circuit LS2N has the same electrical characteristics as those of the level-shift circuit LS1N. The level-shift circuit LS2P may have the same circuit configuration as that of the level-shift circuit LS1P so that the level-shift circuit LS2P has the same electrical characteristics as those of the level-shift circuit LS1P. Further, the level-shift circuits LS1N, LS2N, LS1P, and LS2P may have the same circuit configuration.

Similarly, by making the dummy TIA circuit DTIAN have the same circuit configuration as that of the TIA circuit TIAN, it is possible to reduce the influence of variations in the respective electrical characteristics. Further, by making the level-shift circuit LS2P have the same circuit configuration as that of the level-shift circuit LS1P, it is possible to reduce the influence of variations in the respective electrical characteristics. As a result, the accuracy of adjustment of the offset between the average value of the voltage signal VtiaP and the reference voltage VrefP by the automatic offset control circuit AOC20 can be improved.

The TIA circuit TIAP and the level-shift circuit LS1N are an example of a first voltage signal circuit. The dummy TIA circuit DTIAP and the level-shift circuit LS2N are an example of a first reference voltage circuit. The TIA circuit TIAP is an example of a first amplifier circuit. The dummy TIA circuit DTIAP is an example of a second amplifier circuit that generates a first fixed voltage.

The TIA circuit TIAN and the level-shift circuit LS1P are an example of a second voltage signal circuit. The dummy TIA circuit DTIAN and the level-shift circuit LS2P are an example of a second reference voltage circuit. The buffer circuits BUF1 circuits and BUF2 are an example of a differential amplifier circuit.

The TIA circuit TIAP includes an inverting amplifier circuit INVP1 and a resistive element RP1. The input of the inverting amplifier circuit INVP1 is electrically coupled to an input node InP via an input terminal TIAPin of the TIA circuit TIAP. The output of the inverting amplifier circuit INVP1 is connected to the level-shift circuit LS1N via an output node TIAPout of the TIA circuits TIAP. The resistive element RP1 is connected between the input node TIAPin and the output node TIAPout.

The TIA circuit TIAP converts the input current IinP input to the input node TIAPin into a voltage signal by the inverting amplifier circuit INVP1 and the resistive element RP1, inversely amplifies the voltage signal, and outputs the inversely amplified voltage signal to the output node TIAPout. The inverting amplifier circuit INVP1 performs, for example, inverting amplification. For example, when the input current IinP increases, the voltage outputted to the node TIAPout decreases, and when the input current IinP decreases, the voltage outputted to the node TIAPout increases. The gain of the TIA circuit TIAP is expressed as impedance (resistance value). The gain of the TIA circuit TIAP is mainly determined by the resistance value of the resistive element RP1.

The level-shift circuit LS1N includes, for example, a resistive element RLS1N, a capacitative element CLS1N, and a current source ILS1N. The resistive element RLS1N and the capacitative element CLS1N are connected in parallel to each other between the node TIAPout and a node VtiaN connected to a first input of the buffer circuit BUF1. The current source ILS1N is connected between the power supply line VCC and the node VtiaN.

The level-shift circuit LS1N level-shifts the voltage signal TIAPout output from the TIA circuit TIAP to the high potential side by the DC voltage generated in the resistive element RLS1N to generate a voltage signal VtiaN. The DC voltage of the resistive element RLS1N is generated when a DC current supplied from the current source ILS1N flows through the resistive element RLS1N. The voltage signal TIAPout is an example of a first intermediate voltage signal. The capacitative element CLS1N transmits high-frequency components of the signal input to the level-shift circuit LS1N to the output earlier than the resistive element RLS1N. For example, deterioration of the falling edge and falling of the pulse wave of the voltage signal whose level is shifted by the level-shift circuit LS1N is suppressed by the capacitative element CLS1N. The capacitative element CLS1N is a so-called speed-up capacitor.

The current source ILS1N can be configured by, for example, a p-channel MOS transistor. In order to adjust an amount of current to be supplied, the current source ILS1N may be configured by a current mirror circuit including the p-channel MOS transistor. Alternatively, the current source ILS1N may be configured by using a resistive element instead of the p-channel MOS transistor.

Thus, the average value of the output voltage of the level-shift circuit LS1N can be made greater than the average value of the input voltage of the level-shift circuit LS1N. Then, the level-shift circuit LS1N can set the voltage range of the voltage signal VtiaN input to the buffer BUF1 to a voltage range for appropriately operating the buffer circuit BUF1.

For example, the signal component of the voltage signal VtiaN generated in accordance with the signal component of the input current IinP is superimposed on the voltage value (average value) of the voltage signal VtiaN and input to the buffer circuit BUF1. Although the current from the current source ILS1N flows into the output node TIAPout of the TIA circuit TIAP, the amount of current flowing from the current source ILS1N into the TIA circuit TIAP is offset by increasing the amount of current of the current source (ITIA in FIG. 15) inside of the TIA circuit TIAP.

Instead of increasing the current amount of the current source ITIA in the TIA circuit TIAP, a current source may be added between the ground line GND and the input node of the level-shift circuit LS1N connected to the output node TIAPout, and the current from the current source ILS1N may be caused to flow through the current source. The current source added at this time may be, for example, an n-channel MOS transistor. The current source to be added may be configured by a current mirror circuit including the n-channel MOS transistor in order to adjust the amount of current. Alternatively, the current source to be added may be configured using a resistive element instead of the n-channel MOS transistor.

The dummy TIA circuit DTIAP has, for example, the same circuit configuration as that of the TIA circuit TIAP except that an input current is not input to the input node. By configuring the dummy TIA circuit DTIAP with the same circuit elements as the TIA circuit TIAP, it is possible to simplify the circuit design of the reception circuit 200. The dummy TIA circuit DTIAP includes an inverting amplifier circuit INVP2 and a resistive element RP2 connected between an output and an input of the inverter amplifier circuit INVP2.

For example, the inverting amplifier circuit INVP2 may have the same circuit configuration as that of the inverting amplifier circuit INVP1, and the resistive element RP2 may have the same resistance value as that of the resistive element RP1. The dummy TIA circuit DTIAP generates a predetermined reference voltage and outputs the generated reference voltage to the level-shift circuit LS2N. For example, the voltage value of the reference voltage of the dummy TIA circuit DTIAP is set to be smaller than the voltage value of the voltage signal TIAPout output from the TIA circuit TIAP when the input current IinP is zero (extraction is not performed when the input current IinP is zero).

The level-shift circuit LS2N includes, for example, a resistive element RLS2N, a capacitative element CLS2N, and a current source ILS2N. The resistive element RLS2N is coupled between the output of the dummy TIA circuit DTIAP and the reference voltage line VrefN. The capacitative element CLS2N is connected between the reference voltage line VrefN and the ground line GND. The current source ILS2N is connected between the power supply line VCC and the reference voltage line VrefN.

The level-shift circuit LS2N level-shifts the fixed voltage output from the dummy TIA circuit DTIAP to the high potential side by the DC voltage generated in the resistive element RLS2N to generate the reference voltage VrefN on the reference voltage line VrefN. The DC voltage of the resistive element RLS2N is generated when the current supplied from the current source ILS2N flows through the resistive element RLS2N. Similar to the level-shift circuit LS1N, the level-shift circuit LS2N can make the average value of the output voltage of the level-shift circuit LS2N greater than the average value of the input voltage of the level-shift circuit LS2N.

The capacitative element CLS2N causes noise generated in the reference voltage line VrefN to flow to the ground line GND, and stabilizes the voltage of the reference voltage line VrefN (reference voltage VrefN). The capacitative element CLS2N is a so-called bypass capacitor. The current source ILS2N can be configured by, for example, a p-channel MOS transistor. In order to adjust the amount of current to be supplied, the current source ILS2N may be configured by a current mirror circuit including the p-channel MOS transistor. Alternatively, the current source ILS2N may be configured by using a resistive element instead of the p-channel MOS transistor.

For example, when the current source ILS1N is formed by a p-channel MOS transistor, the current source ILS2N may also be formed by a p-channel MOS transistor. In this case, the p-channel MOS transistor constituting the current source ILS2N preferably has the same electrical characteristics as those of the p-channel MOS transistor constituting the current source ILS1N.

Although the current from the current source ILS2N flows into the dummy TIA circuit DTIAP, the amount of current flowing from the current source ILS2N into the dummy TIA circuit DTIAP is offset by increasing the amount of current of the internal current source of the dummy TIA circuit DTIAP. Instead of increasing the current amount of the internal current source of the dummy TIA circuit DTIAP, a current source may be added between the ground line GND and the input node of the level-shift circuit LS2N connected to the output node of the dummy TIA circuit DTIAP, and the current from the current source ILS2N may flow to the current source.

As will be described later, the reference voltage VrefN is set to a value smaller than the average voltage value of the voltage signal VtiaN when the input current IinP is zero in a state where the automatic offset control circuit AOC1 is not in operation (when the feedback current Iaoc1P=0). When the input current IinP becomes greater than zero, the voltage value (average value) of the voltage signal VtiaN decreases, and when the input current IinP further continues to increase, the voltage value (average value) of the voltage signal VtiaN eventually becomes smaller than the reference voltage VrefN.

When the voltage value (average value) of the voltage signal VtiaN is smaller than the reference voltage VrefN, the current signal inputted to the input node TIAPin can be reduced by extracting the feedback current Iaoc1P from the input current IinP input to the input terminal InP, and the voltage value (average value) of the voltage signal VtiaN can be raised to approach the reference voltage VrefN. As a result, the automatic offset control circuit AOC1 can perform automatic offset control for suppressing an increase in the offset between the average value of the voltage signal VtiaN and the reference voltage VrefN.

The TIA circuit TIAN includes an inverting amplifier circuit INVN1 and a resistive element RN1. The input of the inverting amplifier circuit INVN1 is electrically connected to the input terminal InN via the input node TIANin of the TIA circuit TIAN. The output of the inverting amplifier circuit INVN1 is connected to the level-shift circuit LS1P via the output node TIANout of the TIA circuit TIAN. The resistive element RN1 is connected between the input node TIANin and the output node TIANout.

The TIA circuit TIAN converts the input current IinN input to the input node TIANin into a voltage signal by the inverting amplifier circuit INVN1 and the resistive element RN1, inverts and amplifies the voltage signal, and outputs the inverted and amplified voltage signal to the output node TIANout. The inverting amplifier circuit INVN1 performs, for example, inverting amplification. For example, when the input current IinN increases, the voltage output to the node TIANout decreases, and when the input current IinN decreases, the voltage output to the node TIANout increases. The gain of the TIA circuit TIAN is expressed as impedance (resistance). The gain of the TIA circuit TIAN is mainly determined by the resistance value of the resistive element RN1.

The level-shift circuit LS1P includes, for example, a resistive element RLS1P, a capacitative element CLS1P, and a current source ILS1P. The resistive element RLS1P and the capacitative element CLS1P are connected in parallel between the output node TIANout of the TIA circuit TIAN and the node VtiaP connected to a second input of the buffer circuit BUF1. The current source ILS1P is connected between the power supply line VCC and the node VtiaP.

The level-shift circuit LS1P level-shifts the voltage signal TIANout output from the TIA circuit TIAN to the high potential side by the DC voltage generated in the resistive element RLS1P to generate a voltage signal VtiaP. The DC voltage of the resistive element RLS1P is generated when a current supplied from the current source ILS1P flows through the resistive element RLS1P. The capacitative element CLS1P transmits a high-frequency component of the signal input to the level-shift circuit LS1P to the output earlier than the resistive element RLS1P. For example, deterioration of the falling edge and falling of the pulse wave of the voltage signal whose level is shifted by the level-shift circuit LS1P are suppressed by the capacitative element CLS1P. The capacitative element CLS1P is a so-called speed-up capacitor.

The current source ILS1P can be configured by, for example, a p-channel MOS transistor. In order to adjust the amount of current to be supplied, the current source ILS1P may be configured by a current mirror circuit including the p-channel MOS transistor. Alternatively, the current source ILS1P may be configured by using a resistive element instead of the p-channel MOS transistor.

This enables to make the average value of the output voltage of the level-shift circuit LS1P greater than the average value of the input voltage of the level-shift circuit LS1P. The level-shift circuit LS1P can set the voltage range of the voltage signal VtiaP input to the buffer circuit BUF1 to a voltage range for appropriately operating the buffer circuit BUF1.

For example, the signal component of the voltage signal VtiaP generated in accordance with the signal component of the input current IinN is superimposed on the voltage value (average value) of the voltage signal VtiaP and input to the buffer circuit BUF1. Although the current from the current source ILS1P flows into the TIA circuit TIAN, the amount of current flowing from the current source ILS1P into the TIA circuit TIAN is offset by increasing the amount of current of the current source (for example, similar to the current source ITIA of the TIA circuit TIAP illustrated in FIG. 15) inside the TIA circuit TIAN.

Instead of increasing the amount of current of the current source in the TIA circuit TIAN, a current source may be added between the ground line GND and the input node of the level-shift circuit LS1P connected to the output node TIANout, and the current from the current source ILS1P may be supplied to the current source. The current source added at this time may be formed of, for example, an n-channel MOS transistor. The current source to be added may be configured by a current mirror circuit including the n-channel MOS transistor in order to adjust the amount of current. Alternatively, the current source to be added may be configured using a resistive element instead of the n-channel MOS transistor.

The dummy TIA circuit DTIAN has, for example, the same circuit configuration as that of the TIA circuit TIAN except that an input current is not input to the input node. By configuring the dummy TIA circuit DTIAN with the same circuit elements as those of the TIA circuit TIAN, it is possible to simplify the circuit design of the reception circuit 200. The TIA circuit TIAP, the dummy TIA circuit DTIAP, the TIA circuit TIAN, and the dummy TIA circuit DTIAN may be configured by the same circuit elements. Further, the level-shift circuits LS1N, LS2N, LS1P, and LS2P may be configured by the same circuit elements.

The dummy TIA circuit DTIAN includes an inverting amplifier circuit INVN2 and a resistive element RN2 connected between the output and the input of the inverting amplifier circuit INVN2. For example, the inverting amplifier circuit INVN2 may have the same circuit configuration as that of the inverting amplifier circuit INVN1, and the resistive element RN2 may have the same resistance value as that of the resistive element RN1. The dummy TIA circuit DTIAN generates a predetermined reference voltage, and outputs the generated reference voltage to the level-shift circuit LS2P. For example, the voltage value of the reference voltage of the dummy TIA circuit DTIAN is set to the voltage value of the voltage signal TIANout output from the TIA circuit TIAN when the input current IinN is zero (extraction is not performed when the input current IinN is zero).

The level-shift circuit LS2P includes, for example, a resistive element RLS2P, a capacitative element CLS2P, and a current source ILS2P. The resistive element RLS2P is connected between the output of the dummy TIA circuit DTIAN and the reference voltage line VrefP. The capacitative element CLS2P is connected between the reference voltage line VrefP and the ground line GND. The current source ILS2P is connected between the power supply line VCC and the reference voltage line VrefP.

The level-shift circuit LS2P level-shifts the fixed voltage VrefP output from the dummy DTIAN circuit TIA to the high potential side by the DC voltage generated in the resistive element RLS2P to generate the reference voltage VrefP on the reference voltage line VrefP. The DC voltage of the resistive element RLS2P is generated when a current supplied from the current source ILS2P flows through the resistive element RLS2P. Similar to the level-shift circuit LS1P, the level-shift circuit LS2P can make the average value of the output voltage of the level-shift circuit LS2P greater than the average value of the input voltage of the level-shift circuit LS2P.

The capacitative element CLS2P causes noise generated in the reference voltage line VrefP to flow to the ground line GND, and stabilizes the voltage of the reference voltage line VrefP (reference voltage VrefP). The capacitative element CLS2P is a so-called bypass capacitor. The current source ILS2P can be configured by, for example, a p-channel MOS transistor. In order to adjust the amount of current to be supplied, the current source ILS2P may be configured by a current mirror circuit including the p-channel MOS transistor. Alternatively, the current source ILS2P may be configured by using a resistive element instead of the p-channel MOS transistor.

For example, when the current source ILS1P is formed by a p-channel MOS transistor, the current source ILS2P may also be formed by a p-channel MOS transistor. In this case, the p-channel MOS transistor constituting the current source ILS2P preferably has the same electrical characteristics as those of the p-channel MOS transistor constituting the current source ILS1P.

Although the current from the current source ILS2P flows into the dummy TIA circuit DTIAN, the amount of current flowing from the current source ILS2P into the dummy TIA circuit DTIAN is offset by increasing the amount of current of the internal current source of the dummy TIA circuit DTIAN. Instead of increasing the current amount of the internal current source of the dummy TIA circuit DTIAN, a current source may be added between the ground line GND and the input node of the level-shift circuit LS2P connected to the output node of the dummy TIA circuit DTIAN, and the current from the current source ILS2P may flow to the current source.

As will be described later, the reference voltage VrefP is set to a value smaller than the average voltage value of the voltage signal VtiaP when the input current IinN is zero in a state where the automatic offset control circuit AOC20 is not in operation (when a feedback current Iaoc1$n$=0). When the input current IinN becomes greater than zero, the voltage value (average value) of the voltage signal VtiaP decreases, and when the input current IinN further continues to increase, the voltage value (average value) of the voltage signal VtiaP eventually becomes smaller than the reference voltage VrefP.

When the voltage value (average value) of the voltage signal VtiaP is smaller than the reference voltage VrefP, the feedback current Iaoc1N is extracted from the input current IinN input to the input terminals InN to increase the voltage value (average value) of the voltage signal VtiaP so as to approach the reference voltage VrefP. As a result, the automatic offset control circuit AOC20 can perform automatic offset control for suppressing an increase in the offset between the average value of the voltage signal VtiaP and the reference voltage VrefP.

The automatic offset control circuit AOC1 includes input terminals InP and InN connected to the nodes VrefN and VtiaN, respectively, a feedback current terminal Iaoc1 connected to the input terminal InP, and a feedback current terminal Iaoc2 connected to the reference voltage line VrefN. The automatic offset control circuit AOC1 subtracts the feedback current Iaoc1P from the input current IinP input to the input terminal InP or outputs the feedback current Iaoc2N to the reference voltage line VrefN in accordance with the difference VrefN−VtiaNave between the reference voltage VrefN and the average value VtiaNave of the voltage signal VtiaN.

The automatic offset control circuit AOC1 performs control to switch the magnitudes of the feedback currents Iaoc1P and Iaoc2N in accordance with whether the input current IinP is smaller or greater than a predetermined value. For example, when the input current IinP is smaller than the predetermined value, the automatic offset control circuit AOC1 performs control such that the feedback current Iaoc2N to be added to the current supplied by the current source ILS2N is supplied without flowing the feedback current Iaoc1P.

Here, the addition of the current is performed by causing the feedback current Iaoc2 to flow through the resistive element RLS2 in the same direction as the direction of the current supplied by the current source ILS2. When the input current IinP is equal to or greater than the predetermined value, the automatic offset control circuit AOC1 controls the feedback currents Iaoc1P and Iaoc2N to flow in accordance with the input current IinP. The feedback current Iaoc2N is an example of a first feedback current, and the feedback current Iaoc1P is an example of a second feedback current.

The reference voltage VrefN and the voltage signal VtiaN vary in accordance with the input current IinP. For example, when the feedback current Iaoc1P does not flow, the voltage signal VtiaN decreases as the input current IinP increases. Further, when the input current IinP decreases, the voltage signal VtiaN increases. Therefore, the voltage signal VtiaN is generated as an inverted amplified signal of the input current IinP. Further, by causing the feedback current Iaoc2N to flow, the reference voltage VrefN becomes greater than that in the case where the feedback current Iaoc2N is not caused to flow.

Therefore, the automatic offset control circuit AOC1 can perform the above-described automatic offset control by monitoring the reference voltage VrefN and the voltage signal VtiaN. That is, the automatic offset control circuit AOC1 can control the feedback current Iaoc1P (0 mA or more) and the feedback current Iaoc2N (0 mA or more) so that the offset between the reference voltage VrefN and the voltage signal VtiaN falls within the allowable range.

As a result, the buffer circuit BUF1 can be operated at an appropriate operating point regardless of the magnitude of the input current IinP, and a preferable amplification operation in which the DC offset is suppressed can be performed. An example of the circuit configuration of the automatic offset control circuit AOC1 is illustrated in FIG. 3, and an example of the operation of the automatic offset control circuit AOC1 is illustrated in FIG. 4. That is, the automatic offset control circuit AOC1 of the reception circuit 200 may be the same as the automatic offset control circuit AOC1 of the reception circuit illustrated in FIG. 1.

When the input current IinP is greater than the predetermined value, the automatic offset control circuit AOC1 may cause not only the feedback current Iaoc1P but also the feedback current Iaoc2N to flow with respect to an increase in the input current IinP. As a result, a base-collector voltage Vcbp of the first stage cascode transistor (transistor Q2 in FIG. 15) can be increased.

More specifically, by causing the feedback current Iaoc2N to flow, the reference voltage VrefN increases by a small amount with respect to the increase in the input current IinP, and the voltage value (average value) of the voltage signal VtiaN approaches the reference voltage VrefN. Therefore, the voltage value (average value) of the voltage signal VtiaN increases compared to a case where the feedback current Iaoc2N is not caused to flow. Therefore, the operation margin of the first voltage signal circuit (the TIA circuit TIAP+the level-shift circuit LS1N) when the input current IinP is large can be increased.

The current value of the input current IinP for switching the magnitudes of the feedback currents Iaoc1P and Iaoc2N can be set by adjusting the value of the reference voltage VrefN when the feedback current Iaoc2n=0 mA. For example, the value of the reference voltage VrefN when the feedback current Iaoc2n=0 mA is set to be smaller than the voltage value (average value) of the voltage signal VtiaN when the input current IinP=0 mA. The reference voltage VrefN is adjusted by adjusting the current value of the current source ILS2N of the level-shift circuit LS2N. For example, the current value of the input current IinP for switching the magnitudes of the feedback currents Iaoc1P and Iaoc2N is referred to as Iswitch.

At this time, the current flowing through the current source ILS2N is set such that the reference voltage VrefN becomes equal to "the voltage value (average value) of the voltage signal VtiaN when IinP=Iswitch". For example, it is assumed that the reference voltage circuit (the dummy TIA circuit DTIAP+the level-shift circuit LS2N) has the same electrical characteristics as those of the voltage signal circuit (the TIA circuit TIAP+the level-shift circuit LS1N), and that the resistance values of the resistive elements RLS1N and RLS2N are equal. At this time, the current value of the current source ILS1N is set to be greater than the current value of the current source ILS2N.

The automatic offset control circuit AOC20 has, for example, the same circuit configuration as that of the automatic offset control circuit AOC1. The automatic offset control circuit AOC20 has, for example, the same electrical characteristics as those of the automatic offset control circuit AOC1. Therefore, the automatic offset control circuit AOC20 operates in the same manner as the automatic offset control circuit AOC1. The automatic offset control circuit AOC20 includes the input terminals Inp and Inn connected to the nodes VrefP and VtiaP, respectively, the feedback current terminal Iaoc1 connected to the input terminal InN, and the feedback current terminal Iaoc2 connected to the reference voltage line VrefP.

The automatic offset control circuit AOC20 subtracts the feedback current Iaoc1N from the input current IinN or outputs a feedback current Iaoc2P to the reference voltage line VrefP in accordance with an offset between the reference voltage VrefP and the voltage signal VtiaP received at the input terminals Inp and Inn, respectively. The feedback current Iaoc2P is an example of a third feedback current, and the feedback current Iaoc1N is an example of a fourth feedback current.

The reference voltage VrefP and the voltage signal VtiaP vary in accordance with the input current IinN.

Therefore, the automatic offset control circuit AOC20 can perform automatic offset control by monitoring the reference voltage VrefP and the voltage signal VtiaP. That is, the automatic offset control circuit AOC20 can control the feedback current Iaoc1N (0 mA or more) and the feedback current Iaoc2P (0 mA or more) such that the offset between the average value of the voltage signal VtiaP and the reference voltage VrefP falls within an allowable range. As a result, the buffer circuit BUF1 can be operated at an appropriate operating point regardless of the magnitude of the input current IinN, and preferable amplification characteristics with suppressed offsets can be obtained.

When the input current IinN is greater than a predetermined value, not only the feedback current Iaoc1N but also the feedback current Iaoc2P is caused to flow with respect to an increase in the input current IinN, so that the base-collector voltage of the first stage cascode transistor of the TIA circuit TIAN can be increased. More specifically, by causing the feedback current Iaoc2P to flow, the reference voltage VrefP increases by a small amount with respect to the increase in the input current IinN, and the voltage value (average value) of the voltage signal VtiaP approaches the reference voltage VrefP. Therefore, the voltage value (average value) of the voltage signal VtiaN increases compared to a case where the feedback current Iaoc2P is not caused to flow. Accordingly, the operation margin of the voltage signal circuit (the TIA circuit TIAN+the level-shift circuit LS1P) when the input current IinN is large can be increased.

The current value of the input current IinN for switching the magnitudes of the feedback currents Iaoc1N and Iaoc2P can be set by adjusting the value of the reference voltage VrefP when the feedback current Iaoc2P=0 mA. For example, the value of the reference voltage VrefP when the feedback current Iaoc2P=0 mA is set to be smaller than the voltage value (average value) of the voltage signal VtiaP when the input current IinN=0 mA. The reference voltage VrefP is adjusted by adjusting the current value of the current source ILS2P of the level-shift circuit LS2P.

The buffer circuit BUF1 includes a differential input and a differential output. The buffer circuit BUF1 amplifies the difference VtiaN−VtiaP between the voltages of the pair of voltage signals VtiaN and VtiaP, and outputs the amplified differential signal to the buffer circuit BUF2. The buffer circuit BUF1 is, for example, a differential amplifier circuit. The buffer circuit BUF2 includes a difference input and a difference output. The buffer circuit BUF2 amplifies the differential signal received from the buffer circuit BUF1, and outputs the amplified differential signal as differential signal OutN and OutP to the output terminals OutN and outP. The buffer circuit BUF2 is, for example, a differential amplifier circuit. The differential signal OutN and OutP corresponds to a voltage difference OutN−OutP between the voltages of the pair of voltage signals OutN and OutP.

For example, the voltage signal VtiaN is input to the non-inverting input terminal of the buffer circuit BUF1, and the voltage signal VtiaP is input to the inverting input terminal of the buffer circuit BUF1. The non-inverting input terminal and the inverting input terminal constitute a differential input. The non-inverting output terminal of the buffer circuit BUF1 is connected to the non-inverting input terminal of the buffer circuit BUF2, and the inverting output terminal of the buffer circuit BUF1 is connected to the inverting input terminal of the buffer circuit BUF2.

The non-inverting output terminal and the inverting output terminal constitute a differential output. The voltage signal OutN is output from the non-inverting output terminal of the buffer circuit BUF2, and the voltage signal OutP is output from the inverting output terminal of the buffer circuit BUF2. As a result, the reception circuit 200 can amplify the differential voltage signals VtiaN and VtiaP generated from the differential input currents IinP and IinN, and output the amplified differential voltage signals as the differential signal OutN and outP.

The automatic offset control circuit AOC5 is connected between the differential input and differential output of the buffer circuit BUF2. The automatic offset control circuit AOC5 monitors the voltages of the differential signal OutN and OutP output from the buffer BUF2. The automatic offset control circuit AOC5 performs automatic offset control for suppressing an increase in the offset of the differential signal OutN and OutP by causing a current to flow through at least one of the differential outputs of the buffer circuit BUF1 in accordance with the monitoring result.

<Circuit Configuration of TIA Circuit>

Figure 15:
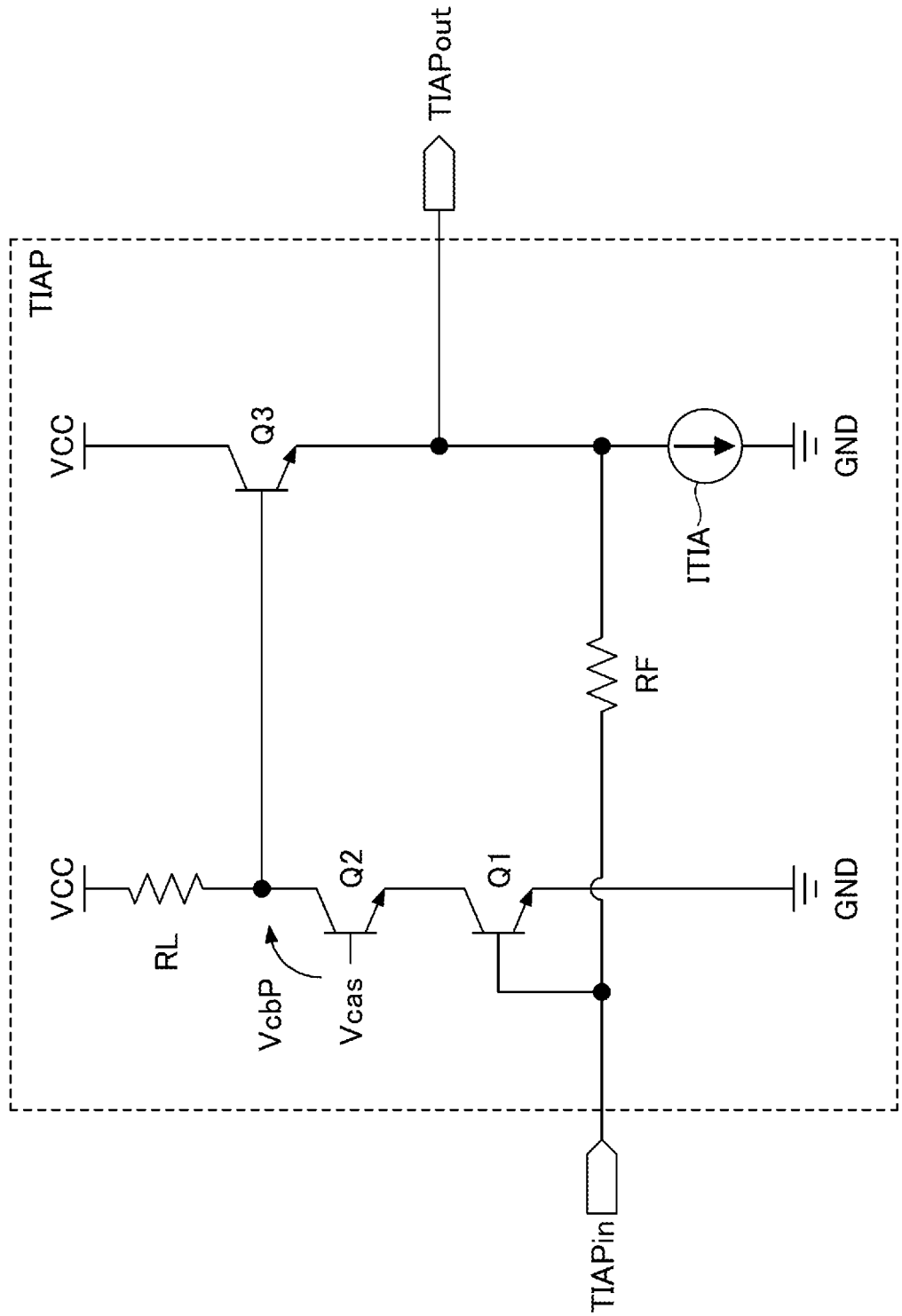
FIG. 15 is a circuit diagram illustrating an example of a TIA circuit of FIG. 14.

FIG. 15 is a circuit diagram illustrating an example of the TIA circuit TIAP of FIG. 14. The circuit configuration of the TIA circuit TIAN illustrated in FIG. 14 is the same as that illustrated in FIG. 15 except for the names of the input port and the output port. The circuit configuration of each of the dummy TIA circuits DTIAP and DTIAN in FIG. 14 is the same as that in FIG. 15 except that no input current is input to the input terminals (the input terminals are in an open state).

The TIA circuit TIAP illustrated in FIG. 15 has the same circuit configuration as that of the TIA circuit TIA illustrated in FIG. 2. Therefore, the description of the TIA circuits TIAP and TIAN and the dummy TIA circuits DTIAP and DTIAN is omitted here. The feedback resistive element RF illustrated in FIG. 15 corresponds to RP1, RN1, RP2, and RN2 in the TIA circuits TIAP and TIAN and the dummy TIA circuits DTIAP and DTIAN, respectively.

<Circuit Configuration of Automatic Offset Control Circuit AOC1>

The automatic offset control circuit AOC1 of the reception circuit 200 illustrated in FIG. 14 is the same as the automatic offset control circuit AOC1 of the reception circuit 100 illustrated in FIG. 1. Therefore, the description of the automatic offset control circuit AOC1 is omitted here.

As illustrated in FIG. 14, the automatic offset control circuit AOC1 receives the reference voltage VrefN at the input terminal Inp and receives the voltage signal VtiaN at the input terminal Inn. The automatic offset control circuit AOC1 outputs the feedback current Iaoc2N from the feedback current terminal Iaoc2, and draws the feedback current Iaoc1P into the feedback current terminal Iaoc1.

As illustrated in FIG. 14, the automatic offset control circuit AOC20 receives the reference voltage VrefP at the input node Inp and receives the voltage signal VtiaP at the input node Inn. The automatic offset control circuit AOC20 outputs the feedback current Iaoc2P from the feedback current terminal Iaoc2, and draws the feedback current Iaoc1N into the feedback current terminal Iaoc1.

As described above, in the automatic offset control circuit AOC1, the input terminal Inp is connected to the reference voltage line VrefN in FIG. 14, and the input terminal Inn is connected to the voltage line VtiaN in FIG. 14. Therefore, when the input current IinP is smaller than a predetermined value and the voltage value (average value) of the voltage signal VtiaN is greater than the reference voltage value VrefN, a current flows only through the feedback current terminals Iaoc2. When the input current IinP is greater than the predetermined value and the voltage value (average value) of the voltage signal VtiaN is smaller than the reference voltage value VrefN, a current flows through both of the feedback current terminals Iaoc1 and Iaoc2.

The transistor PM3 may be removed from the automatic offset control circuit AOC1. In this case, when the input voltage value Vinn is smaller than the input voltage value Vinp, that is, when the voltage value VtiaN is smaller than the reference voltage value VrefN, only the feedback current Iaoc1P may be caused to flow. For example, when the input current IinP increases, the voltage value (average value) of the voltage signal TIAPout output from the TIA circuit TIAP decreases. In this regard, if the TIA circuit TIAP can perform a predetermined amplification operation with respect to such a decrease in the voltage value (average value) of the voltage signal TIAPout, only the feedback current Iaoc1P may be caused to flow when the input current IinP is greater than a predetermined value. Similarly, when the automatic offset control circuit AOC20 has a circuit configuration similar to that of the automatic offset control circuit AOC1 in FIG. 1, the transistor PM3 may be omitted.

The automatic offset control circuit AOC1 can control generation and switching of the feedback currents Iaoc1P and Iaoc2N in accordance with the voltage signal VtiaN that changes depending on the input current IinP. As a result, the reception circuit 200 having the operation characteristics illustrated in FIG. 16 can be configured, and the increase in the offset of the differential signal OutP and OutN can be suppressed while suppressing the noise in the region where the input current IinP is small.

Further, since the feedback current Iaoc2N continues to flow even after the feedback current Iaoc1P starts to flow due to an increase in the input current IinP, the operation margin of the first voltage signal circuit (the TIA circuit TIAP+the level-shift circuit LS1N) can be increased. In the automatic offset control circuit AOC20, the same effect as described above can be obtained.

<Operation Characteristics of Reception Circuit>

Figure 16:
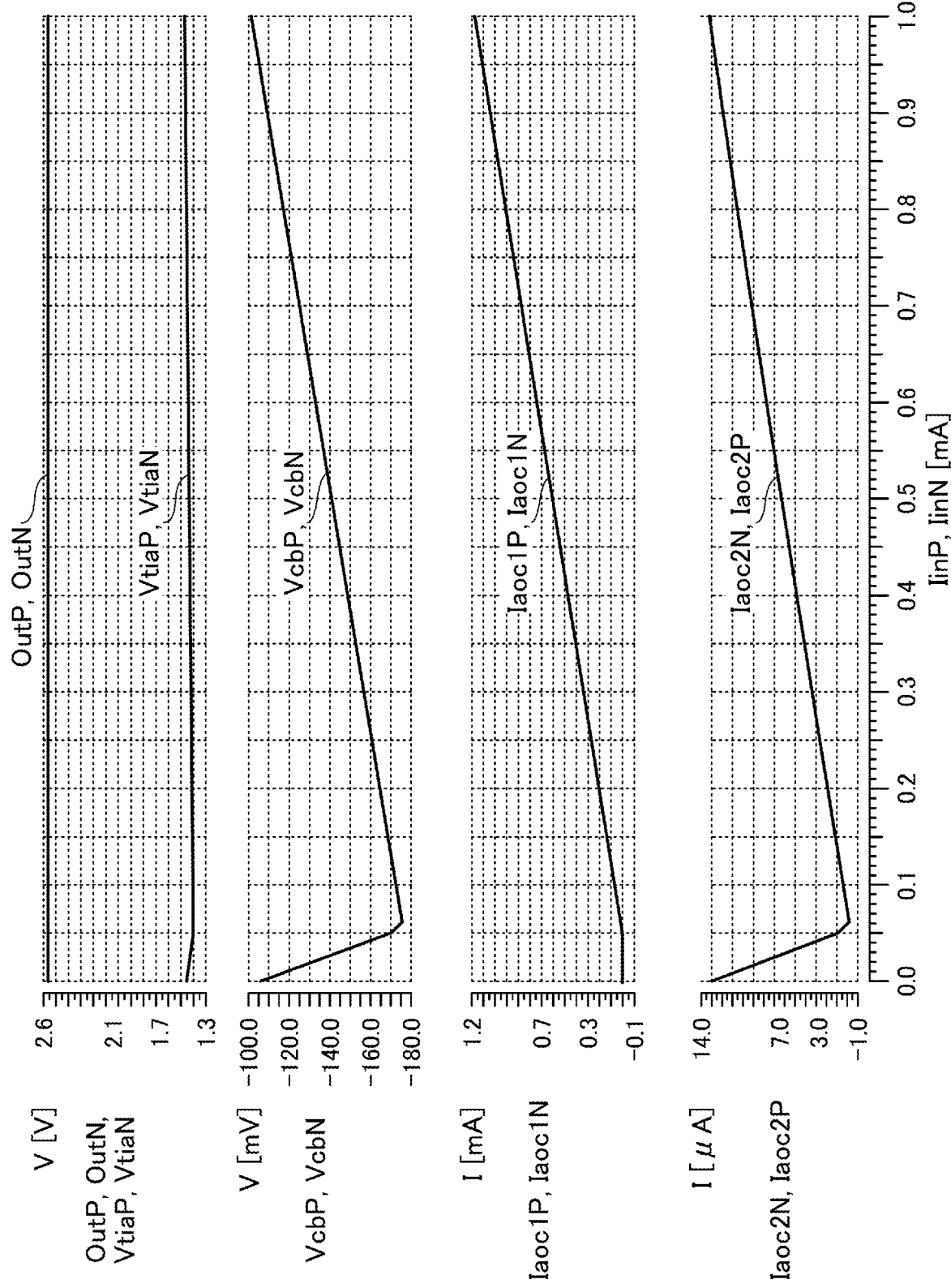
FIG. 16 is a diagram illustrating an example of operation characteristics of the reception circuit illustrated in FIG. 14.

FIG. 16 is a diagram illustrating an example of operation characteristics (DC operation characteristics) of the reception circuit 200 illustrated in FIG. 14. FIG. 16 illustrates results of circuit simulation. The horizontal axis of FIG. 16 represents the input currents IinP and IinN. The vertical axis in FIG. 16 represents the voltages of the differential signal OutP and OutN, the voltage signals VtiaP and VtiaN, the base-collector voltages Vcbp and VcbN, and the feedback currents Iaoc1P, Iaoc1N, Iaoc2N, and Iaoc2P. The base-collector voltage VcbN is a base-collector voltage of a first stage cascode transistor (corresponding to the transistor Q2 in FIG. 15) of the inverting amplifier circuit INVN1 in the TIA circuit TIAN in FIG. 14. Each value represents an average value (DC component) of the voltage or current.

FIG. 16 illustrates that the offset of the voltage signals VtiaP and VtiaN are reduced regardless of the magnitudes of the input currents IinP and IinN. Thus, the offset of the differential signal OutP and OutN is also reduced. The automatic offset control circuit AOC1 switches the control of the feedback currents Iaoc1P and Iaoc2N using, for example, the input current Iin=0.06 mA as a threshold value. Similarly, the automatic offset control circuit AOC20 switches the control of the feedback currents Iaoc1N and Iaoc2P using, for example, the input current Iin=0.06 mA as a threshold value. The threshold value of the input current Iin can be set by setting the voltage value of the reference voltage VrefN to be smaller than the voltage value of the voltage signal VtiaN when the input current IinP is zero. When the input current IinN is zero, the reference voltage VrefP can be set by setting the voltage value of the reference voltage VrefP to be smaller than the voltage value of the voltage signal VtiaP. Since the automatic offset control circuits AOC1 and AOC20 of the reception circuit 200 illustrated in FIG. 14 operate in the same manner as the automatic offset control circuit AOC1 of the reception circuit 100 illustrated in FIG. 1, detailed description thereof will be omitted.

In FIG. 16, for example, in a region where each of the input currents IinP and IinN is approximately 0.06 mA or less, the feedback currents Iaoc1P and Iaoc1N are 0 mA. Thus, the offset of the voltage signals VtiaN and VrefN can be reduced regardless of the input current IinP, and the offset of the voltage signals VtiaP and VrefP can be reduced regardless of the input current IinN. As a result, the voltage range of the voltage signals VtiaN and VtiaP supplied to the buffer circuit BUF1 can be set to a voltage range for appropriately operating the buffer circuit BUF1.

Furthermore, by setting the feedback currents Iaoc1P and Iaoc1N to 0 mA in a region where the input currents IinP and IinN are small, noise in a region where the input currents IinP and IinN are small can be reduced. Therefore, the reception circuit 200 can reduce the offset of the voltage signals VtiaN and VrefN and can reduce the offset of the voltage signals VtiaP and VrefP while suppressing the deterioration of the noise characteristics in the region where the input currents IinP and IinN are small.

Further, the feedback currents Iaoc2N and Iaoc2P decrease to 0 mA when the control of the automatic offset control circuits AOC1 and AOC2 is switched, and then increase together with the feedback currents Iaoc1P and Iaoc1N in accordance with an increase in the input currents IinP and IinN. Thus, in a region where the input currents IinP and IinN are large, the base-collector voltages Vcbp and VcbN of the first stage cascode transistor of the TIA circuits TIAP and TIAN can be increased. As a result, the operation margin of the first voltage signal circuit (the TIA circuit TIAP+the level-shift circuit LS1N) and the second voltage signal circuit (the TIA circuit TIAN+the level-shift circuit LS1P) can be increased.

More specifically, the voltage value of the reference voltage VrefN is increased by causing the feedback current Iaoc2N to flow into the level-shift circuit LS2N, and the voltage value (average value) of the voltage signal VtiaN is brought close to the reference voltage VrefN by the operation of the automatic offset control circuit AOC1, so that the voltage value (average value) of the voltage signal TIAPout increases and the base-collector voltage Vcbp increases. In order to increase the voltage value (average value) of the voltage signal TIAPout, the feedback current Iaoc1P is slightly increased as compared with the case where the feedback current Iaoc2N does not flow.

Further, the voltage value of the reference voltage VrefP is increased by causing the feedback current Iaoc2P to flow into the level-shift circuit LS2P, and the voltage value (average value) of the voltage signal VtiaP is brought close to the reference voltage VrefP by the operation of the automatic offset control circuit AOC2, so that the voltage value (average value) of the voltage signal TIANout increases and the base-collector voltage VcbN increases. In order to increase the voltage value (average value) of the voltage signal TIANout, the feedback current Iaoc1N is slightly increased as compared with the case where the feedback current Iaoc2P does not flow.

As described above, in the present embodiment, the increase in the offset between the voltage signal VtiaN converted from the input current IinP and the reference voltage VrefN can be suppressed while suppressing the deterioration of the noise characteristics in the range where the input currents IinP and IinN are small. Further, the increase in the offset between the voltage signal VtiaP converted from the input current IinN and the reference voltage VrefP can be suppressed. As a result, the accuracy of the offset adjustment of the voltage signals VtiaN and VtiaP converted from the input currents IinP and IinN can be improved, and the accuracy of the offset adjustment of the differential signal OutN and OutP output from the reception circuit 200 can be improved.

The voltage of the output signal of the inverting amplifier circuit INVP1 is level-shifted by the level-shift circuit LS1N to generate the voltage signal VtiaN, so that the voltage range of the voltage signal VtiaN can be set to the voltage range for appropriately operating the buffer circuit BUF1. Further, by level-shifting the voltage of the output signal of the inverting amplifier circuit INVN1 by the level-shift circuit LS1P to generate the voltage signal VtiaP, the voltage range of the voltage signal VtiaP can be set to the voltage range for appropriately operating the buffer circuit BUF1. As a result, the buffer circuits BUF1 and BUF2 can generate the appropriate differential signal OutN and OutP in accordance with the input currents IinP and IinN.

The level-shift circuit LS2N adds the feedback current Iaoc2N from the automatic offset control circuit AOC1 to the current from the current source ILS2N and flows the added current to the resistive element RLS2N. Further, the level-shift circuit LS2P adds the feedback current Iaoc2P from the automatic offset control circuit AOC20 to the current from the current source ILS2P and flows the added current to the resistive element RLS2P. Thus, in a range where the input currents IinP and IinN are small, the increase in the offset between the voltage signal VtiaN and the reference voltage VrefN and the increase in the DC offset between the voltage signal VtiaP and the reference voltage VrefP can be suppressed while suppressing the deterioration of the noise characteristics.

The dummy TIA circuit DTIAP is configured by the same circuit elements as the circuit configuration of the TIA circuit TIAP, and the level-shift circuit LS2N is configured by the same circuit elements as the circuit elements of the level-shift circuit LS1N. The dummy TIA circuit DTIAN is configured by the same circuit elements as the circuit configuration of the TIA circuit TIAN, and the level-shift circuit LS2P is configured by the same circuit elements as the circuit elements of the level-shift circuit LS1P. Thus, the offset between the voltage signal VtiaN and the reference voltage VrefN can be accurately adjusted, and the offset between the voltage signal VtiaP and the reference voltage VrefP can be accurately adjusted. Furthermore, since common design data can be used, the circuit design of the reception circuit 200 can be simplified.

As illustrated in FIG. 4, the automatic offset control circuit AOC1 switches the magnitude relationship between the feedback current Iaoc2 and the feedback current Iaoc1 in accordance with the control voltages Vaoc1 and Vaoc2. The automatic offset control circuit AOC20 also operates with the characteristics illustrated in FIG. 4, similarly to the automatic offset control circuit AOC1. Thus, the reception circuit 200 having the operation characteristics illustrated in FIG. 16 can be configured. That is, an increase in the offset between the voltage value (average value) of the voltage signal VtiaN and the reference voltage VrefN and an increase in the offset between the voltage value (average value) of the voltage signal VtiaP and the reference voltage VrefP can be suppressed while suppressing the noise characteristics in the region where the input currents IinP and IinN are small.

Since the reference voltage VrefN is greater than the voltage value (average value) of the voltage signal VtiaN when the input current IinP exceeds a predetermined threshold value, the voltage signal VtiaN can be increased in accordance with the extraction of the feedback current Iaoc1P to approach the reference voltage VrefN. Similarly, since the reference voltage VrefP is greater than the voltage value (average value) of the voltage signal VtiaP when the input current IinN exceeds the predetermined value, the voltage signal VtiaP can be increased in accordance with the extraction of the feedback current Iaoc1N to approach the reference voltage VrefP.

As a result, the automatic offset control circuit AOC1 can perform automatic offset control for suppressing an increase in the offset between the voltage signal VtiaN and the reference voltage VrefN. Similarly, the automatic offset control circuit AOC20 can perform automatic offset control for suppressing an increase in DC offset between the voltage signal VtiaP and the reference voltage VrefP.

By integrating the circuits of the reception circuit 200 into a single semiconductor IC chip, for example, the influence due to the variation of the electrical characteristics of the TIA circuit TIAP and the dummy TIA circuit DTIAP can be reduced, and the influence due to the variation of the electrical characteristics of the level-shift circuits LS1N and LS2N can be reduced. For example, by configuring with the same circuit elements, the power supply voltage dependency (or temperature dependency) of the electrical characteristics of the dummy TIA circuit DTIAP can be made similar to the power supply voltage dependency (or temperature dependency) of the electrical characteristics of the corresponding TIA circuit TIAP, and the reception circuit 200 can be more stably operated with respect to the variation of the power supply voltage (or the variation of the temperature). As a result, the accuracy of the adjustment of the offset between the voltage signal VtiaN and the reference voltage VrefN by the automatic offset control circuit AOC1 can be improved. The TIA circuit TIAN, the dummy TIA circuit DTIAN, and the level-shift circuits LS1P and LS2P may also be configured in the same manner as described above.

Sixth Embodiment

<Circuit Configuration of Reception Circuit>

Figure 17:
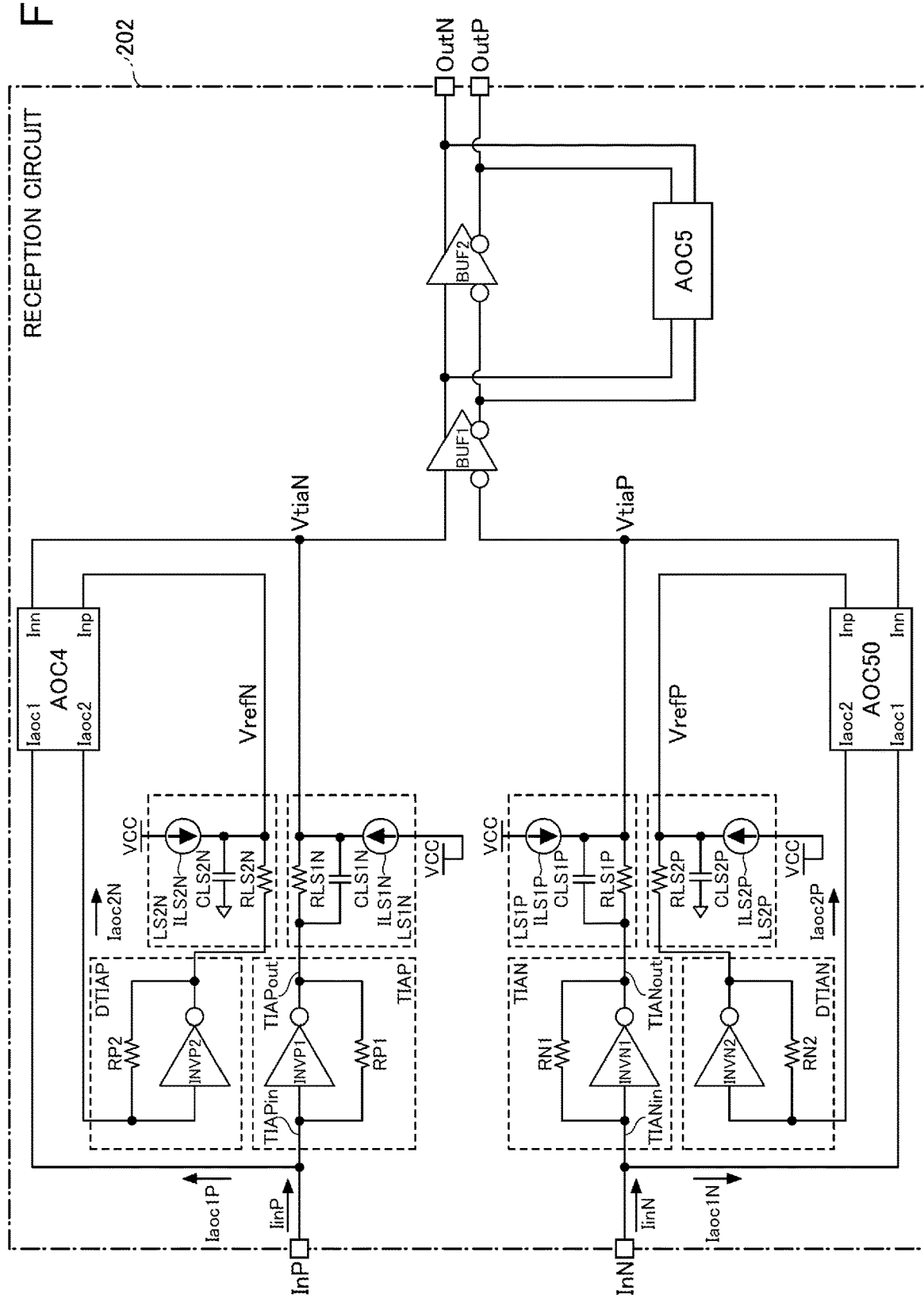
FIG. 17 is a block diagram illustrating an example of a reception circuit according to a sixth embodiment.

FIG. 17 is a block diagram illustrating an example of a reception circuit according to a sixth embodiment. Elements similar to those of the reception circuit 200 of FIG. 14 are denoted by the same reference numerals, and detailed description thereof will be omitted. A reception circuit 202 of FIG. 17 has the same configuration as that of the reception circuit 200 of FIG. 14 except that the automatic offset control circuits AOC1 and AOC20 are replaced with automatic offset control circuits AOC4 and AOC50, respectively. For example, the reception circuit 202 is formed by integrating each circuit element into a single semiconductor integrated circuit chip.

In the present embodiment, a feedback current terminal Iaoc2 of the automatic offset control circuit AOC4 is connected to an input of an inverting amplifier circuit INVP2 of a dummy TIA circuit DTIAP. The automatic offset control circuit AOC4 is different from the automatic offset control circuit AOC1 of FIG. 14 in that the automatic offset control circuit AOC4 has a function of drawing a feedback current Iaoc2N from an input node of the dummy TIA circuit DTIAP.

The feedback current terminal Iaoc2 of the automatic offset control circuit AOC50 is connected to an input of an inverting amplifier circuit INVN2 of the dummy TIA circuit DTIAN. The automatic offset control circuit AOC50 is different from the automatic offset control circuit AOC20 of FIG. 14 in that the automatic offset control circuit AOC50 has a function of drawing a feedback current Iaoc2P from an input node of the dummy TIA circuit DTIAN. The other configurations of the reception circuit 202 are the same as those of the reception circuit 200 in FIG. 14. Similarly to FIG. 14, in FIG. 17, the feedback currents Iaoc1P, Iaoc2N, Iaoc1N, and Iaoc2P have a positive arrow direction.

The automatic offset control circuit AOC4 of the reception circuit 202 illustrated in FIG. 17 is the same as the automatic offset control circuit AOC4 of the reception circuit 102 illustrated in FIG. 11. Therefore, the description of the automatic offset control circuit AOC4 is omitted here. The circuit configuration of the automatic offset control circuit AOC50 in FIG. 17 is also the same as that in FIG. 12.

The operation characteristics of the reception circuit 202 illustrated in FIG. 17 are the same as those of the reception circuit 200 illustrated in FIG. 16 except that the feedback currents Iaoc2N and Iaoc2P have opposite polarities (the direction in which the current flows). That is, the reception circuit 202 can suppress noise in a region where the input currents IinP and IinN are small, and can suppress an increase in an offset between the reference voltage Vref and the current average value (DC component) of the voltage signal Vtia and an increase in an offset between the differential signal OutP and OutN.

The transistor NM5 may be removed from the automatic offset control circuit AOC4. In this case, when the input voltage value VinN is smaller than the input voltage value VinP, that is, when the voltage value VtiaN is smaller than the reference voltage value VrefN, only the feedback current Iaoc1P may be caused to flow. For example, when the input current IinP increases, the voltage value (average value) of the voltage signal TIAPout output from the TIA circuit TIAP decreases. In this regard, if the TIA circuit TIAP can perform a predetermined amplification operation with respect to such a decrease in the voltage value (average value) of the voltage signal TIAPout, only the feedback current Iaoc1P may be caused to flow when the input current IinP is greater than a predetermined value. Similarly, when the automatic offset control circuit AOC50 has a circuit configuration similar to that of the automatic offset control circuit AOC4 in FIG. 12, the transistor NM5 may be omitted.

As described above, also in the present embodiment, the same effects as those of the above-described embodiments can be obtained. For example, an increase in the offset between the voltage value (average value) of the voltage signal VtiaN and the reference voltage VrefN and an increase in the offset between the voltage value (average value) of the voltage signal VtiaP and the reference voltage VrefP can be suppressed while suppressing the degradation of the noise characteristics in the range where the input currents IinP and IinN are small.

Further, in the present embodiment, the feedback current Iaoc2N is drawn from the input node of the inverting amplifier circuit INVP2 by the automatic offset control circuit AOC4. This enables to adjust the reference voltage VrefN by adjusting the input voltage of the inverting amplifier circuit INVP2 and to suppress the increase in the offset between the voltage value (average value) of the voltage signal VtiaN and the reference voltage VrefN.

Further, the feedback current Iaoc2P is drawn from the input node of the inverting amplifier circuit INVN2 by the automatic offset control circuit AOC50. This enables to adjust the reference voltage VrefP by adjusting the input voltage of the inverting amplifier circuit INVN2 and to suppress the increase in the DC-offset between the voltage value (average value) of the voltage signal VtiaP and the reference voltage VrefP.

As described above, the embodiments of the present disclosure have been described; note that the present disclosure is not limited to the embodiments described above. Various changes, modifications, substitutions, additions, deletions, and combinations of these are possible within the scope described in the claims. These are naturally included in the technical scope of the present disclosure.

What is claimed is:

1. A reception circuit comprising:
   an input terminal configured to receive an input current;
   a voltage signal circuit having an input node, the voltage signal circuit being configured to convert a current signal into a voltage signal, the current signal being input to the input node, and the input node being coupled to the input terminal;
   a reference voltage circuit configured to generate a reference voltage in accordance with a first feedback current;
   a differential amplifier circuit configured to generate a differential signal in accordance with a voltage difference between the voltage signal and the reference voltage; and
   an offset control circuit including a first current mirror circuit and a second current mirror circuit, the offset control circuit being configured to generate the first feedback current flowing out from the first current mirror circuit connected to a power supply line and a second feedback current flowing into the second current mirror circuit connected to a ground, adjust the first feedback current such that an offset of the differential signal falls within a tolerance and disable the second feedback current when the voltage signal has an average voltage value greater than the reference voltage, and alternatively disable the first feedback current and subtract the second feedback current from the input current such that the offset of the differential signal falls within the tolerance when the voltage signal has an average voltage value smaller than the reference voltage.

2. The reception circuit according to claim 1, wherein the voltage signal circuit includes a first amplifier circuit and a first level-shift circuit including a first resistive element and a first current source, the first amplifier circuit being configured to convert the current signal input to the input node into an intermediate voltage signal, and the first level-shift circuit being configured to level-shift the intermediate voltage signal by using a voltage drop generated at the first resistive element through which a first current provided from the first current source flows, and output the level-shifted intermediate voltage signal as the voltage signal.

3. The reception circuit according to claim 2, wherein the reference voltage circuit includes a second amplifier circuit and a second level-shift circuit including a second resistive element and a second current source, the second amplifier circuit being configured to generate a fixed voltage, and the second level-shift circuit being configured to level-shift the fixed voltage by using a voltage drop generated at the second resistive element through which a second current provided from the second current source flows, and output the level-shifted fixed voltage as the reference voltage, and
   wherein the first feedback current flows into the second resistive element in a direction in which the second current flows.

4. The reception circuit according to claim 2, wherein the reference voltage circuit includes a second amplifier circuit and a second level-shift circuit including a second resistive element and a second current source, the second amplifier circuit being configured to generate a fixed voltage, and the second level-shift circuit being configured to level-shift the fixed voltage by using a voltage drop generated at the second resistive element through which a second current provided from the second current source flows, and output the level-shifted fixed voltage as the reference voltage, and
   wherein the offset control circuit includes an additional current mirror circuit connected to the ground and drains the first feedback current from the input node of the second amplifier circuit into the additional current mirror circuit.

5. The reception circuit according to claim 3, wherein the second amplifier circuit has a circuit configuration identical to a circuit configuration of the first amplifier circuit.

6. The reception circuit according to claim 1, wherein the offset control circuit includes a differential integration circuit configured to generate a control voltage in accordance with an offset of the differential signal, and
   wherein the offset control circuit switches a magnitude relation between the first feedback current and the second feedback current in accordance with the control voltage.

7. The reception circuit according to claim 1, wherein a value of the reference voltage when the first feedback current is zero is set to be smaller than the average voltage value of the voltage signal when the current signal is zero.

8. The reception circuit according to claim 1, wherein the voltage signal circuit, the reference voltage circuit, the differential amplifier circuit, and the offset control circuit are integrated on a single semiconductor chip.

9. A reception circuit comprising:
a first input terminal configured to receive a first input current;
a first voltage signal circuit having a first input node, the first voltage signal circuit being configured to convert a first current signal into a first voltage signal, the first current signal being input to the first input node, and the first input node being coupled to the first input terminal;
a first reference voltage circuit configured to generate a first reference voltage in accordance with a first feedback current;
a first offset control circuit including a first current mirror circuit and a second current mirror circuit, the first offset control circuit being configured to generate the first feedback current flowing out from the first current mirror circuit connected to a power supply line and a second feedback current flowing into the second current mirror circuit connected to a ground in accordance with a first offset between the first voltage signal and the first reference voltage, adjust the first feedback current such that the first offset falls within a tolerance and disable the second feedback current when the first voltage signal has an average voltage value greater than the first reference voltage, and alternatively disable the first feedback current and subtract the second feedback current from the first input current such that the first offset falls within the tolerance when the first voltage signal has an average voltage value smaller than the first reference voltage;
a second input terminal configured to receive a second input current;
a second voltage signal circuit having a second input node, the second voltage signal circuit being configured to convert a second current signal into a second voltage signal, the second current signal being input to the second input node, and the second input node being coupled to the second input terminal;
a second reference voltage circuit configured to generate a second reference voltage in accordance with a third feedback current;
a second offset control circuit including a third current mirror circuit and a fourth current mirror circuit, the second offset control circuit being configured to generate the third feedback current flowing out from the third current mirror circuit connected to the power supply line and a fourth feedback current flowing into the fourth current mirror circuit connected to the ground in accordance with a second offset between the second voltage signal and the second reference voltage, adjust the third feedback current such that the second offset falls within a tolerance and disable the fourth feedback current when the second voltage signal has an average voltage value greater than the second reference voltage, and alternatively disable the third feedback current and subtract the fourth feedback current from the second input current such that the second offset falls within the tolerance when the second voltage signal has an average voltage value smaller than the second reference voltage; and
a differential amplifier circuit configured to generate a differential signal in accordance with a voltage difference between the first voltage signal and the second voltage signal.

10. The reception circuit according to claim 9, wherein the first voltage signal circuit includes a first amplifier circuit and a first level-shift circuit including a first resistive element and a first current source, the first amplifier circuit being configured to convert the first current signal input to the input node into a first intermediate voltage signal, and the first level-shift circuit being configured to level-shift the first intermediate voltage signal by using a voltage drop generated at the first resistive element through which a first current provided from the first current source flows, and output the level-shifted intermediate voltage signal as the voltage signal.

11. The reception circuit according to claim 10, wherein the first reference voltage circuit includes a second amplifier circuit and a second level-shift circuit including a second resistive element and a second current source, the second amplifier circuit being configured to generate a first fixed voltage, and the second level-shift circuit being configured to level-shift the first fixed voltage by using a voltage drop generated at the second resistive element through which a second current provided from the second current source flows, and output the level-shifted first fixed voltage as the first reference voltage, and wherein the first feedback current flows into the second resistive element in a direction in which the second current flows.

12. The reception circuit according to claim 10, wherein the first reference voltage circuit includes a second amplifier circuit and a second level-shift circuit including a second resistive element and a second current source, the second amplifier circuit being configured to generate a first fixed voltage, and the second level-shift circuit being configured to level-shift the first fixed voltage by using a voltage drop generated at the second resistive element through which a second current provided from the second current source flows, and output the level-shifted first fixed voltage as the first reference voltage, and wherein the first offset control circuit includes an additional current mirror circuit connected to the ground and drains the first feedback current from the input node of the second amplifier circuit into the additional current mirror circuit.

13. The reception circuit according to claim 11, wherein the second amplifier circuit has a circuit configuration identical to a circuit configuration of the first amplifier circuit.

14. The reception circuit according to claim 9, wherein the first offset control circuit includes a differential integration circuit configured to generate a control voltage in accordance with the first offset, and wherein the first offset control circuit switches a magnitude relation between the first feedback current and the second feedback current in accordance with the control voltage.

15. The reception circuit according to claim 9, wherein a value of the first reference voltage when the first feedback current is zero is set to be smaller than the average voltage value of the first voltage signal when the first current signal is zero, and wherein a value of the second reference voltage when the third feedback current is zero is set to be smaller than the average voltage value of the second voltage signal when the second current signal is zero.

16. The reception circuit according to claim 9, wherein the first voltage signal circuit, the first reference voltage circuit, the first offset control circuit, the second voltage signal circuit, the second reference voltage circuit, the second offset control circuit, and the differential amplifier circuit are integrated on a single semiconductor chip.

* * * * *